(12) United States Patent
Sasaki et al.

(10) Patent No.: US 11,926,740 B2
(45) Date of Patent: Mar. 12, 2024

(54) RESIN COMPOSITION, FILM, OPTICAL FILTER, IMAGE DISPLAY DEVICE, SOLID-STATE IMAGING ELEMENT, AND COMPOUND

(71) Applicant: FUJIFILM Corporation, Tokyo (JP)

(72) Inventors: Daisuke Sasaki, Kanagawa (JP); Akihiro Hara, Kanagawa (JP); Kunihiko Kodama, Kanagawa (JP); Nobutaka Fukagawa, Kanagawa (JP); Yu Naito, Kanagawa (JP); Hiroki Kuwahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 878 days.

(21) Appl. No.: 16/992,668

(22) Filed: Aug. 13, 2020

(65) Prior Publication Data

US 2020/0369890 A1 Nov. 26, 2020

Related U.S. Application Data

(63) Continuation of application No. PCT/JP2019/005863, filed on Feb. 18, 2019.

(30) Foreign Application Priority Data

Feb. 28, 2018 (JP) .................... 2018-035022

(51) Int. Cl.
*C09B 57/00* (2006.01)
*C08K 5/3445* (2006.01)
(Continued)

(52) U.S. Cl.
CPC .......... *C09B 57/007* (2013.01); *C08K 5/3445* (2013.01); *G02B 5/223* (2013.01); *G02F 1/133509* (2013.01); *H01L 27/14621* (2013.01)

(58) Field of Classification Search
CPC .... C09B 57/007; C08K 5/3445; G02B 5/223; G02F 1/133509; H01L 27/14621
See application file for complete search history.

(56) References Cited

U.S. PATENT DOCUMENTS 4,806,488 A 2/1989 Berger, Jr. et al.
4,830,786 A 5/1989 Pease et al.
(Continued)

FOREIGN PATENT DOCUMENTS

CN 101960337 A 1/2011
CN 103309158 A 9/2013
(Continued)

OTHER PUBLICATIONS

Machine translation of WO 2008/090757 (Year: 2008).*
(Continued)

*Primary Examiner* — Doris L Lee
(74) *Attorney, Agent, or Firm* — Edwards Neils LLC; Jean C. Edwards, Esq.

(57) ABSTRACT

Provided are a resin composition including a compound represented by Formula (1) and a resin, a film and a filter including the resin composition, a liquid crystal display device and a solid-state imaging element including the filter, and a compound suitable as a light absorbing component of the resin composition and the filter.

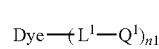

Formula (1)

In Formula (1), Dye represents a colorant structural part obtained by removing n1 hydrogen atoms from a squarylium compound having a specific structure. $Q^1$ is a structural part in which energy levels of a highest occupied molecular (Continued)

orbital and a lowest unoccupied molecular orbital satisfy a specific condition. $L^1$ represents a divalent linking group and n1 represents an integer of 1 to 4.

10 Claims, 1 Drawing Sheet

(51) Int. Cl.
  *G02B 5/22* (2006.01)
  *G02F 1/1335* (2006.01)
  *H01L 27/146* (2006.01)

(56) References Cited

U.S. PATENT DOCUMENTS

| | | |
|---|---|---|
| 2006/0280652 A1 | 12/2006 | Pitner et al. |
| 2011/0049444 A1 | 3/2011 | Sako et al. |
| 2020/0131337 A1 | 4/2020 | Matsumura |

FOREIGN PATENT DOCUMENTS

| | | |
|---|---|---|
| JP | 62-103572 A | 5/1987 |
| JP | 1-232349 A | 9/1989 |
| JP | 2007-063364 A | 3/2007 |
| JP | 2008-500446 A | 1/2008 |
| JP | 2008-145480 A | 6/2008 |
| JP | 2009-139911 A | 6/2009 |
| JP | 2010-065069 A | 3/2010 |
| JP | 2017-203902 A | 11/2017 |
| WO | 2008/090757 A1 | 7/2008 |
| WO | WO 2008/090757 * | 7/2008 |
| WO | 2019/044505 A1 | 3/2019 |

OTHER PUBLICATIONS

International Search Report issued in PCT/JP2019/005863 dated Apr. 23, 2019.
Written Opinion issued in PCT/JP2019/005863 dated Apr. 23, 2019.
International Preliminary Report on Patentability completed by WIPO on Sep. 1, 2020 in connection with International Patent Application No. PCT/JP2019/005863.
Office Action, issued by the Korean Intellectual Property Office dated Jan. 6, 2022, in connection with Korean Patent Application No. 10-2020-7022772.
Office Action, issued by the State Intellectual Property Office dated Oct. 9, 2021, in connection with Chinese Patent Application No. 201980015397.2.
Decision to Grant a Patent issued by the Japanese Patent Office dated Apr. 27, 2021, in connection with Japanese Patent Application No. 2020-503409.

* cited by examiner

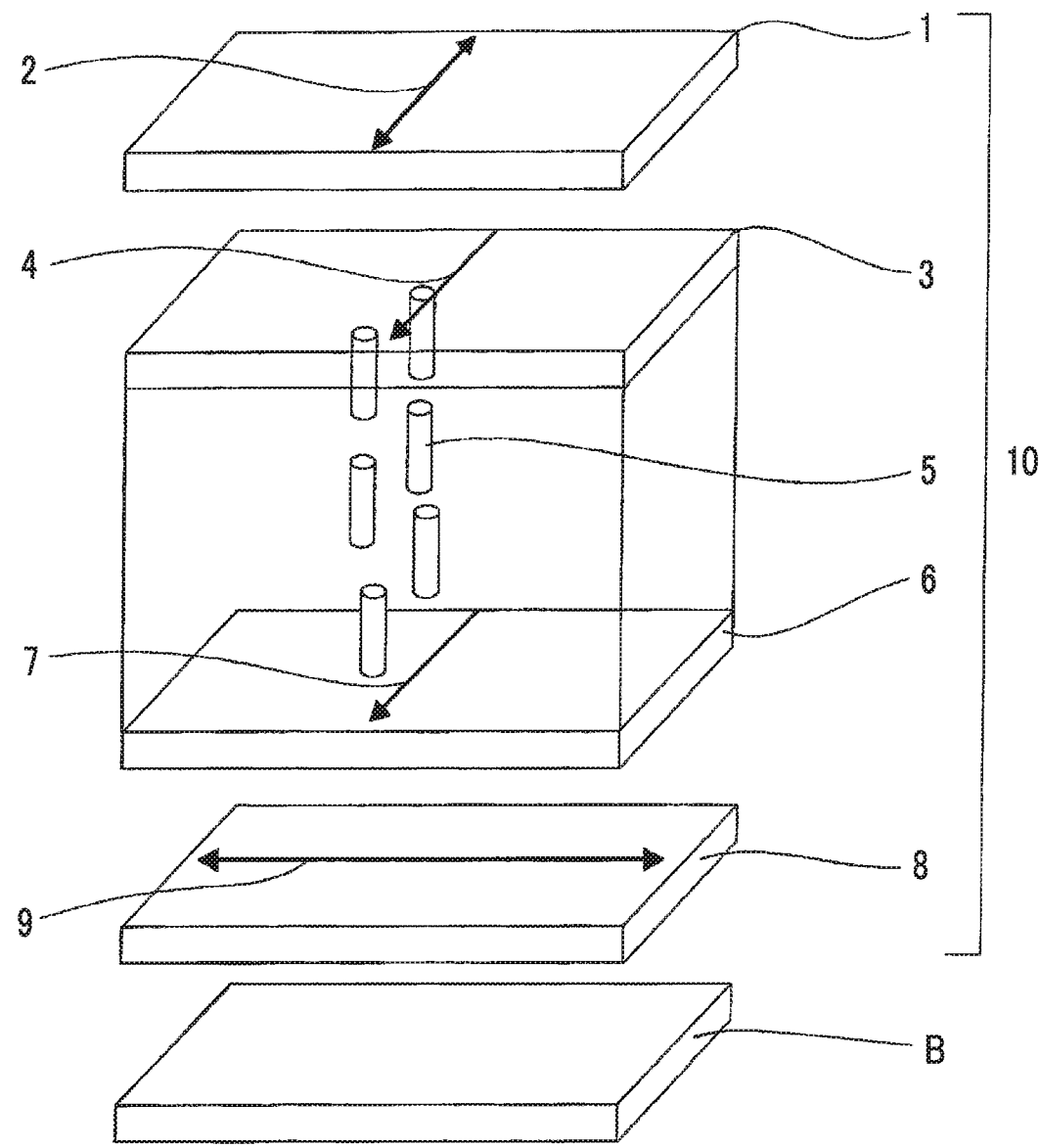

RESIN COMPOSITION, FILM, OPTICAL FILTER, IMAGE DISPLAY DEVICE, SOLID-STATE IMAGING ELEMENT, AND COMPOUND

CROSS-REFERENCE TO RELATED APPLICATIONS

This application is a Continuation of PCT International Application No. PCT/JP2019/005863 filed on Feb. 18, 2019, which was published under PCT Article 21(2) in Japanese, and which claims priority under 35 U.S.C. § 119 (a) to Japanese Patent Application No. 2018-035022 filed in Japan on Feb. 28, 2018. The above applications are hereby expressly incorporated by reference, in their entirety, into the present application.

BACKGROUND OF THE INVENTION

1. Field of the Invention

The present invention relates to a resin composition suitable as a constituent material of an optical filter, a film and an optical filter formed of the resin composition, and an image display device and a solid-state imaging element formed of the optical filter. In addition, the present invention relates to a compound suitable as a light absorbing component of the resin composition.

2. Description of the Related Art

A liquid crystal display device is widely used as a space-saving image display device with low power consumption. In a market in which high-quality images are required, such as a television, there is an increasing demand for improvement in color reproducibility in addition to a resolution.

In the liquid crystal display device, a liquid crystal panel displaying images is a non-light emitting element which does not emit light itself. Therefore, a backlight unit is disposed on a rear surface of the liquid crystal panel and supplies light to the liquid crystal panel.

In recent years, as a light source for the backlight unit, a white light emitting diode (LED) has been used. As a light emitting device formed of the white LED, a device of producing white light by mixing blue light radiated from a blue LED and light radiated from a yellow fluorescent body, or a green fluorescent body and a red fluorescent body is known. However, the above-described device has a problem in that a color reproduction range is narrow compared to an organic light emitting diode (OLED) or the like which is in the spotlight as a next-generation display. There is a demand for new technique for overcoming this problem, a technique in which a coating layer including a dye is provided on a diffusion film in the backlight unit, thereby blocking light having an unnecessary wavelength which is emitted from the white LED, has been proposed. In addition, In WO2008/090757A and JP2008-145480A, color correcting filters formed of squarylium colorants having a specific substituent are proposed.

SUMMARY OF THE INVENTION

However, as a result of studies with regard to the colorant disclosed in WO2008/090757A and JP2008-14540A, the present inventors have found that, in a case where an optical filter formed of the colorant is used, for example, as a protective film for a polarizing plate used in a liquid crystal display device, fluorescence emitted according to an absorption of light by the colorant causes depolarization, which towers the polarization performance of the polarizing plate (a disadvantage in achieving high contrast). In addition, it has also been clarified that a light absorption capacity of the optical filter easily decreases over time by irradiation with light.

Therefore, an object of the present invention is to provide a film and an optical filter which are capable of blocking light at a target specific wavelength, such as a light having an unnecessary wavelength which is emitted from a white LED, are capable of effectively suppressing fluorescence emission, and have an excellent light resistance, a resin composition suitable as a constituent material of the film and the optical filter, and an image display device and a solid-state imaging element comprising the optical filter. In addition, an object of the present invention is to provide a compound suitable as a light absorbing component of the resin composition.

As a result of repeated intensive studies with regard to the above-described objects, the present inventors have found that, in a case where a composition including a compound having the following structure, that is, a compound (a) having a specific squarylium colorant structural part, and further, (b) having a structural part in which an energy level difference between a highest occupied molecular orbital (HOMO) and a lowest unoccupied molecular orbital (LUMO) is a certain level or more, and an absolute value of the energy level of HOMO and/or the energy level of LUMO is lower than an absolute value of an energy level of an orbital corresponding to the squarylium colorant structural part, and having a structure in which the respective structural parts of (a) and (b) are linked by a divalent linking group, and a resin forms an optical filter, it is possible to obtain an optical filter which is capable of specifically absorbing and blocking the light at a target specific wavelength by the squarylium colorant structural part of the compound, is also capable of effectively suppressing fluorescence emission excited from the squarylium colorant structural part by the absorption of light, and further has an excellent light resistance.

The present invention has been completed by further repeating studies on the basis of the above-described finding.

That is, the above-described objects can be achieved by the following methods.

[1] A resin composition comprising:
a compound represented by Formula (1); and
a resin,

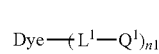

Formula (1)

in Formula (I), Dye represents a colorant structural part obtained by removing n hydrogen atoms from a compound represented by Formula (2), Formula (2)

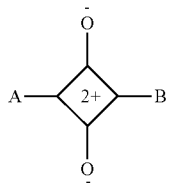

in Formula (2), A and B represent an aryl group and a heterocyclic group, or —CH=G, in which G represents a heterocyclic group, $Q^1$ represents a structural part satisfying the following (i) and (ii), (i) an energy level difference between a highest occupied molecular orbital and a lowest unoccupied molecular orbital is 2.9 eV or more, (ii) an absolute value of the energy level of the lowest unoccupied molecular orbital is lower than an absolute value of an energy level of a lowest unoccupied molecular orbital of Dye or an absolute value of the energy level of the highest occupied molecular orbital is lower than an absolute value of an energy level of a highest occupied molecular orbital of Dye, $L^1$ represents a divalent linking group in which a linking part with $Q^1$ is composed of an alkylene group, or a divalent linking group which is directly bonded to a ring-constituting carbon atom of an aliphatic ring included in $Q^1$, and n1 represents an integer of 1 to 4,

[2] The resin composition according to [1], in which $Q^1$ represents a structural part obtained by removing one hydrogen atom from a compound represented by any one of Formulae (5) to (13), Formula (5)

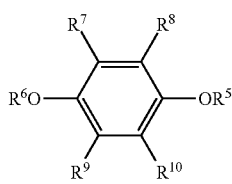

Formula (6)

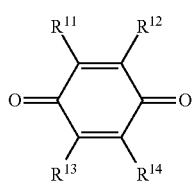

Formula (7)

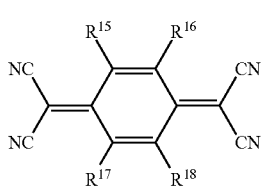

Formula (8)

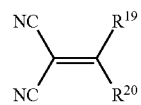

Formula (9)

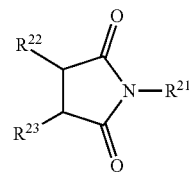

Formula (10)

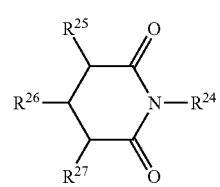

Formula (11)

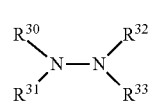

Formula (12)

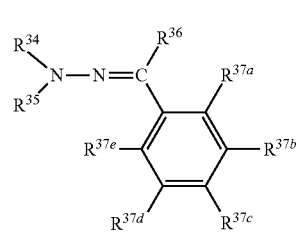

Formula (13)

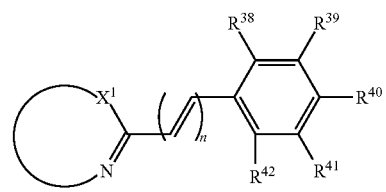

$R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$ represent a hydrogen atom or a substituent, $R^{21}$ and $R^{24}$ represent a hydrogen atom, an alkyl group, an aryl group, or a heterocyclic group, provided that, in a case where $R^{21}$ and $R^{24}$ are hydrogen atoms, $Q^1$ is bonded to the linking group $L^1$ at a nitrogen atom position from which the hydrogen atom has been removed, $X^1$ represents an oxygen atom, a sulfur atom, or a carbon atom, and n represents an integer of 1 to 3.

[3] The resin composition according to [1] or [2],
in which A in Formula (2) is a heterocyclic group.
[4] The resin composition according to any one of [1] to [3],
in which Dye represents a colorant structural part obtained by removing n1 hydrogen atoms from a compound represented by Formula (3), Formula (3)

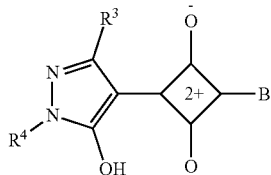

R$^3$ and R$^4$ represent a hydrogen atom or a substituent, and B is the same as B in Formula (2).
[5] The resin composition according to any one of [1] to [4],
in which the resin is at least one kind of a polystyrene resin, a cellulose acylate resin, an acrylic resin, or a cycloolefin resin.
[6] A film comprising:
the resin composition according to any one of [1] to [5],
[7] An optical filter comprising:
the resin composition according to any one of [1] to [5].
[8] An image display device comprising:
the optical filter according to [7].
[9] A solid-state imaging element comprising:
the optical filter according to [7].
[10] A compound represented by Formula (1A), Formula (1A)

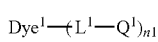

in Formula (1A), Dye$^1$ represents a colorant structural part obtained by removing n1 hydrogen atoms from a compound represented by Formula (2A), Formula (2A)

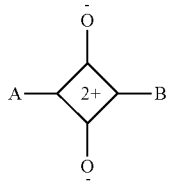

in Formula (2A), A represents a heterocyclic group and B represents an aryl group, a heterocyclic group, or —CH=G, in which G represents a heterocyclic group,
Q$^1$ represents a structural part satisfying the following (i) and (ii),
(i) an energy level difference between a highest occupied molecular orbital and a lowest unoccupied molecular orbital is 2.9 eV or more,
(ii) an absolute value of the energy level of the lowest unoccupied molecular orbital is lower than an absolute value of an energy level of a lowest unoccupied molecular orbital of Dye, or an absolute value of the energy level of the highest occupied molecular orbital is lower than an absolute value of an energy level of a highest occupied molecular orbital of Dye,
L$^1$ represents a divalent linking group in which a linking part with Q$^1$ is composed of an alkylene group, or a divalent linking group which is directly bonded to a ring-constituting carbon atom of an aliphatic ring included in Q$^1$, and
n1 represents an integer of 1 to 4.
[11] The compound according to [10],
in which Dye$^1$ represents a colorant structural part obtained by removing n1 hydrogen atoms from a compound represented by Formula (3), Formula (3)

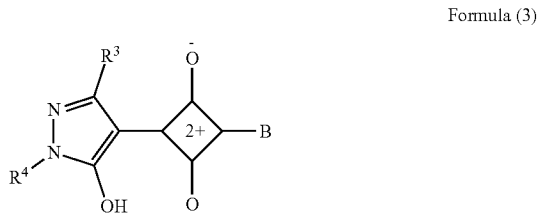

R$^3$ and R$^4$ represent a hydrogen atom or a substituent, and B is the same as B in Formula (2A).

In the present invention, in compounds (colorants) represented by chemical structural formulae described in the present specification, cations are present in a delocalized manner, and a plurality of tautomer structures is present. Therefore, in the present invention, in a case where at least one tautomer structure of a certain colorant matches a chemical structural formula defined as each formula, the colorant is considered as a colorant represented by the individual general formula. Therefore, a colorant represented by a specific general formula can also be said to be a colorant having at least one tautomer structure which can be represented by the specific general formula. In the present invention, a colorant represented by a general formula may have any tautomer structure as long as at least one tautomer structure of the colorant matches the general formula.

In the present invention, numerical ranges expressed using "to" include numerical values before and after "to" as the lower limit value and the upper limit value.

In the present invention, in a case of a plurality of substituents, linking groups, and the like (hereinafter, referred to as a substituent and the like) represented by a specific reference, or in a case of simultaneously or alternatively defining a plurality of the substituent and the like, it means that each of the substituent and the like limy be the same as or different from each other. The same applies to the definition of the number of substituents and the like. In a case where a plurality of the substituents and the like is near (particularly, adjacent to each other), it means that the substituents and the like may be linked to each other or condensed to form a ring.

In the present invention, the expression of a compound is used to include the compound itself, a salt thereof, and an ion thereof. In addition, it means that a part of the structure may be changed as long as the desired effect is not impaired. Examples of the salt of the compound include an acid-addition salt of the compound, formed of the compound and an inorganic acid or an organic acid, and a base-addition salt of the compound, formed of the compound and an inorganic base or an organic base. In addition, examples of the ion of the compound include ions generated by dissolving the salt of the compound in water, a solvent, or the like.

In the present specification, regarding a substituent (the same applies to a linking group) in which whether it is substituted or unsubstituted is not specified, within the range not impairing the desired effect, it means that the group may have any substituent. The same applies to a compound or a repeating unit in which whether it is substituted or unsubstituted is not specified.

In the present invention, in a case of defining a number of carbon atoms of a group, the number of carbon atoms means the number of carbon atoms of the entire group. That is, in a case of an aspect in which the group has a substituent, it means the total number of carbon atoms including the substituent.

In the present invention, in the case where a group can form an acyclic skeleton and a cyclic skeleton, unless described otherwise, the group includes an acyclic skeleton group and a cyclic skeleton group. For example, an alkyl group includes, unless described otherwise, a linear alkyl group, a branched alkyl group, and a cyclic (cyclo) alkyl group. In a case where a group forms a cyclic skeleton, the lower limit of the number of carbon atoms in the cyclic skeleton group is preferably 3 or more and more preferably 5 or more, regardless of the lower limit of the number of carbon atoms specifically described for the group.

In the present invention, the term "(meth)acrylic" is used to include both methacrylic and acrylic.

The film and optical filter according to an aspect of the present invention are capable of blocking light at a target specific wavelength, such as a light having an unnecessary wavelength which is emitted from a white LED, are capable of effectively suppressing fluorescence emission, and have an excellent light resistance. In addition, the image display device and solid-state imaging element according to an aspect of the present invention are excellent in image contrast. In addition, the resin composition according to an aspect of the present invention is suitable as a material for forming the optical filter according to the aspect of the present invention. In addition, the compound according to an aspect of the present invention is suitable as a light absorbing component of the resin composition according to the aspect of the present invention.

BRIEF DESCRIPTION OF THE DRAWINGS

FIG. 1 is a schematic view showing an outline of an embodiment of a liquid crystal display device comprising a polarizing plate which has the optical filter of the present invention in a backlight.

DESCRIPTION OF THE PREFERRED EMBODIMENTS

Resin Composition

The resin composition according to the embodiment of the present invention is formed of a colorant compound having a specific structure and a resin as a binder. The colorant compound is formed by linking, by a specific linking structure, a structural part of a squarylium colorant having absorption in a specific wavelength range of visible light and a structural part suppressing fluorescence emission in a case where the squarylium colorant structural part is excited by absorption of light. The resin composition according to the embodiment of the present invention is suitable as a constituent material of the optical filter (filter including a colorant compound and a resin) according to the embodiment of the present invention.

Colorant

The colorant compound used in the resin composition according to the embodiment of the present invention is represented by Formula (1).

In Formula (1), Dye represents a colorant structural part obtained by removing n1 hydrogen atoms from a compound represented by Formula (2).

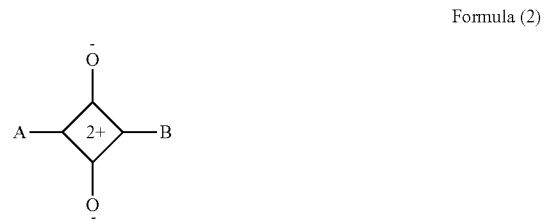

In Formula (2), A and B represent an aryl group, a heterocyclic group, or —CH=G, in which G represents a heterocyclic group.

$L^1$ represents a divalent linking group in which a linking part with $Q^1$ is composed of an alkylene group, or a divalent linking group which is directly bonded to a ring-constituting carbon atom of an aliphatic ring included in $Q^1$. The divalent linking group is preferably an alkylene group, and also preferably a group formed of a combination of an alkylene group and a group having a hetero atom (for example, oxygen atom, sulfur atom, or nitrogen atom). The molecular weight of $L^1$ is preferably 14 to 300 and more preferably 14 to 100.

In Formula (1), $L^1$ is a divalent linking group as described above, and is not a single bond. In an aspect in which Dye and $Q^1$ are linked by a single bond, $Q^1$ may affect the hue of Dye, which is not preferable.

Examples of the divalent linking group which can be adopted as $L^1$ include an alkylene group having 1 to 20 carbon atoms, an arylene group having 6 to 20 carbon atoms, a divalent heterocyclic group obtained by removing two hydrogen atoms from a hetero ring, —CH=CH—, —CO—, —CS—, —NR— (R represents a hydrogen atom or a monovalent substituent), —O—, —S—, —SO$_2$—, —N=CH—, and a divalent linking group formed of a combination of a plurality of these (preferably an integer number of 2 to 10). A group selected from the group consisting of an alkylene group having 1 to 8 carbon atoms, an arylene group having 6 to 12 carbon atoms, —CH=CH—, —CO—, —NR— (R is as defined above), —O—, —S—, —SO$_2$—, and —N=CH—, or a divalent linking group of a combination of two or more (preferably an integer number of 2 to 10) groups selected from the group consisting thereof is preferable, and a group selected from the group consisting of an alkylene group having 1 to 4 carbon atoms, a phenylene group, —CO—, —NH—, —O—, -and —SO$_2$—, or a linking group of a combination of two or more (preferably an integer number of 2 to 10)

groups selected from the group consisting thereof is particularly preferable. Specific examples of the divalent linking group of a combination include —COO—, —OCO—, —CONH—, —NHCOO—, —NHCONH—, and —SO$_2$NH—, and further include a group of a combination of —CO—, —COO—, or —CONH—, and an alkylene group or an arylene group.

The alkylene group which can be adopted as $L^1$ or a part of $L^1$ is not particularly limited as long as art alkylene group having 1 to 20 carbon atoms. In addition, examples of the arylene group and heterocyclic group which can be adopted as $L^1$ or a part of $L^1$ include a group obtained by further removing one hydrogen atom from each group exemplified as the aryl group having 6 to 20 carbon atoms, which can be adopted as A in Formula (2), and a group obtained by further removing one hydrogen atom from each group exemplified as the heterocyclic group which can be adopted as A. The substituent which can be adopted as R is not particularly limited, and has the same meaning as the substituent X which may be included in A in Formula (2).

$L^1$ may have one or a plurality of substituents. The substituent which may be included in $L^1$ is not particularly limited, and has the same meaning, for example, as the above-mentioned substituent X. In a case where $L^1$ has a plurality of substituents, substituents bonded to an adjacent atom may be bonded to each other to further form a ring structure.

n1 is an integer of 1 to 4. n1 is preferably 1 to 3 and more preferably 1 or 2.

$Q^1$ represents a structural part satisfying the following (i) and (ii).

(i) an energy level difference between a highest occupied molecular orbital (HOMO) and a lowest unoccupied molecular orbital (LUMO) is 2.9 eV or more.

(ii) an absolute value of the energy level of LUMO is lower than an absolute value of an energy level of LUMO of Dye, and/or an absolute value of the energy level of HOMO is lower than an absolute value of an energy level of HOMO of Dye.

The condition (i) indicates that $Q^1$ has a characteristic of not absorbing in the visible light region. That is, in a case where $Q^1$ satisfies (i) and in a case of a structure in which $Q^1$ is linked to Dye through $L^1$, the hue of Dye (specific and efficient light absorption) is not actually affected.

The condition (ii) is a condition for suppressing fluorescence emitted in a case where Dye in the excited state with the absorption of light returns to the ground state. That is, in a case where the absolute value of the energy level of LUMO of $Q^1$ is lower than the absolute value of the energy level of LUMO of Dye, an electron moved to LUMO due to the excitation of Dye preferentially moves to LUMO of $Q^1$. That is, it is possible to effectively suppress a phenomenon in which the electron moved to LUMO due to the excitation of Dye directly moves to HOMO of Dye and Dye returns to the ground state. As a result, fluorescence emission of Dye is suppressed.

In addition, in a case where the absolute value of the energy level of HOMO of $Q^1$ is lower than the absolute value of the energy level of HOMO of Dye, an electron moves from HOMO of $Q^1$ to HOMO of Dye in which one electron is vacated by the excitation, and HOMO of Dye is filled and stabilized. As a result, the electron moved to LUMO due to the excitation of Dye moves to LUMO of $Q^1$. That is, it is possible to effectively suppress a phenomenon in which the electron moved to LUMO due to the excitation of Dye directly returns to HOMO of Dye, and it is possible to suppress fluorescence emission of Dye.

Here, the above-described mechanism for suppressing fluorescence emission is merely an assumption, and the present invention is not limited to the above-described mechanism.

Furthermore, the compound of Formula (1), used in the present invention, has an excellent light resistance. Usually, in an electron transfer type quenching system (system in which a fluorescent colorant and a quencher coexist), since the colorant is in a state of anion radical or cation radical by an electron transfer, it can be said that light resistance is generally deteriorated. However, the compound (compound having a combination of Dye and $Q^1$ linked by a divalent linking group in the same molecule) of Formula (1) used in the present invention, has an excellent light resistance.

In the compound of Formula (1), Dye is a structure up to a portion where a conjugated structure is interrupted due to that the structure of Formula (2) is linked to $L^1$. For example, in a case of the compound A-1, in the right side of a squarylium structure corresponding to Formula (2), the conjugated structure of the squarylium structure is interrupted by an ethylene group constituting a linking portion with which corresponds to the linking group $L^1$. Here, the conjugated structure means a structure forming a system of connected p-orbitals having delocalized electrons located in alternating single bond and multiple bond, and also includes a structure including a p-orbital donating group, a p-orbital donating atom, or a p-orbital donating group and a p-orbital donating atom. Examples of the p-orbital donating group include a carbonyl group and a sulfonyl group. The p-orbital donating atom is an atom having two lone electron-pairs, one of which occupies a p-orbital, and examples thereof include an oxygen atom, a nitrogen atom, and a sulfur atom. In a case of including a p-orbital donating group and a p-orbital donating atom, examples thereof include a structure of a combination of a plurality (preferably an integer number of 2 to 10) of the p-orbital donating atom and the p-orbital donating group. For example, a divalent group represented by —O—CO—, —NH—CO—, —NH—SO$_2$—, —NH—CO—NH—, and the like is a group which forms the conjugated structure. Here, in the present invention, in a case where a divalent group represented by —O—C(=O)— or —NH—C(=O)— is directly bonded to a ring-constituting atom of an aromatic ring in the squarylium structure, it is interpreted that the conjugated structure of the aromatic ring is interrupted by the divalent group. In this interpretation, the direction in which —O—C(=O)— and —NH—C(=O)— are bonded to the ring-constituting atom of the aromatic ring is not limited.

In addition, the structure of $Q^1$ in the compound of Formula (1) is roughly classified into two aspects (some structures match both aspects).

One aspect is an aspect of a structural part facing with Dye through $L^1$, bonding to an alkylene group included in $L^1$, and satisfying (i) and (ii). In other words, in a structural part facing with Dye through $L^1$, in a case where an alkylene group is interposed in a structure from the terminal of the structural part toward Dye, and the entire structural part from the terminal of the structural part facing with Dye through $L^1$ to just before the alkylene group satisfies (i) and (ii), the alkylene group constitutes $L^1$ (that is, the structure of $Q^1$ is interrupted just before the alkylene group).

For example, in a case of the compound A-1, since a structural part from a methoxy group at the right side to a phenylene group and an ether group is bonded to the ethylene group (alkylene group) and satisfies (i) and (ii), the structural part is $Q^1$.

According to the above-described explanation, in the compound A-1, each structure corresponding to Dye, $L^1$ and $Q^1$ is as follows. In the present specification, represents a linking site.

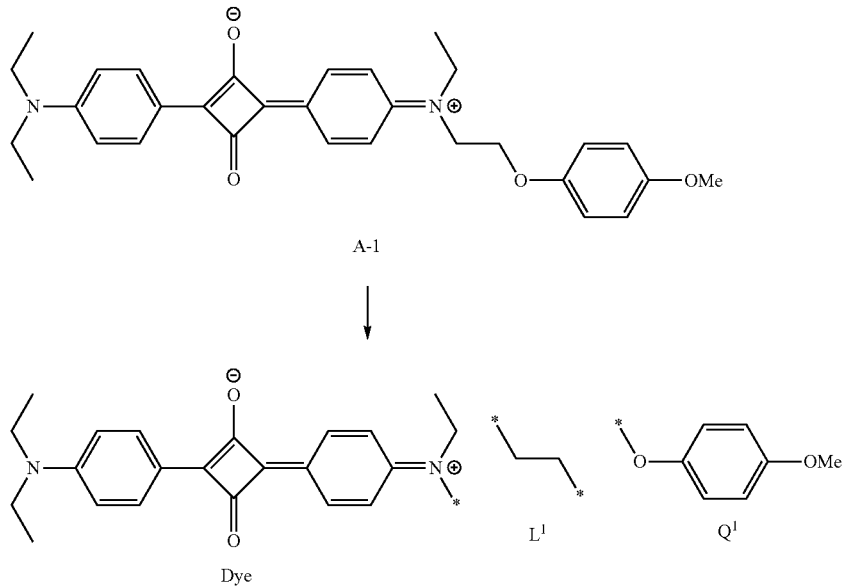

In another aspect of $Q^1$, it is premised that, before considering whether or not a structural part facing with Dye through $L^1$ is bonded to an alkylene group of $L^1$, the structural part facing with Dye through $L^1$ has an aliphatic ring. In this case, in a case where a ring-constituting atom located on Dye side of the aliphatic ring is a carbon atom, and the entire structural part from the terminal of the structural part facing with Dye through $L^1$ to the ring-constituting carbon atom satisfies (i) and (ii), $L^1$ is on Dye side of the ring-constituting carbon atom. That is, a structural part from the terminal of the structural part facing with Dye through $L^1$ to the ring-constituting carbon atom is $Q^1$. The ring-constituting carbon atom may be bonded to the alkylene group of $L^1$, and this case corresponds to the above-described first aspect. In the compound A-2, each structure corresponding to Dye, $L^1$ and $Q^1$ is as follows.

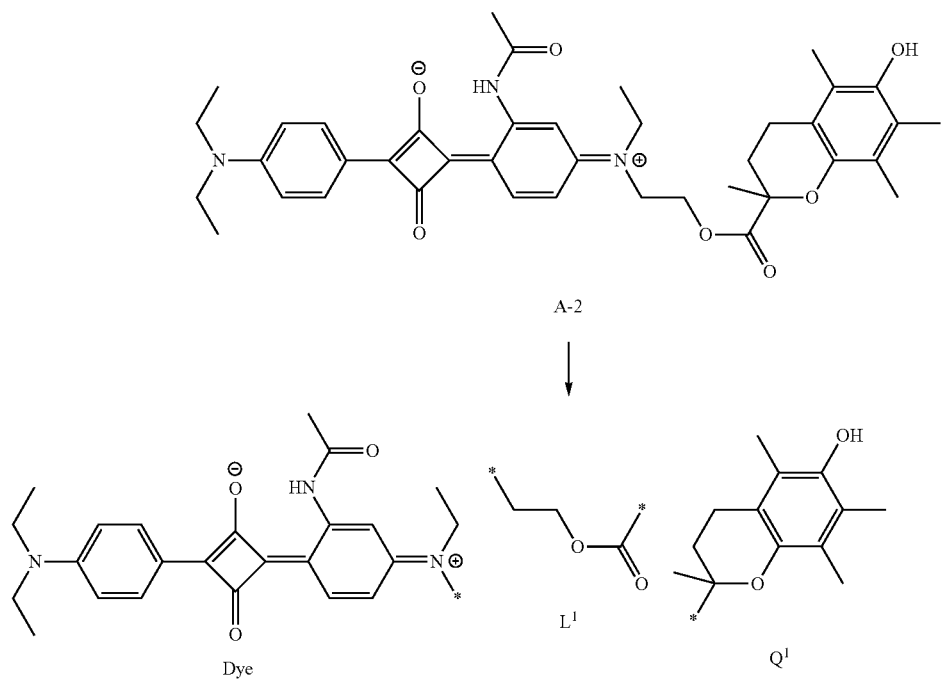

According to the same rules, in the compound A-3, each structure corresponding to Dye, $L^1$ and is also shown as follows.

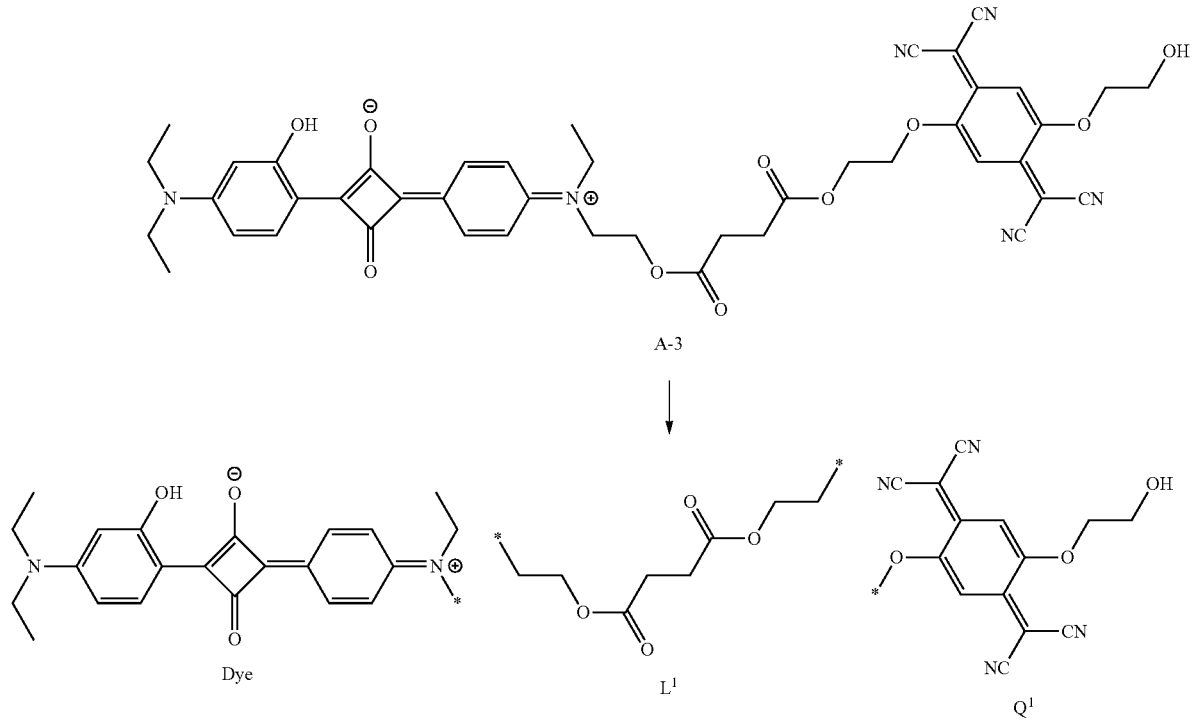

A-3

Dye   $L^1$   $Q^1$

In A-3, OH at the terminal of $Q^1$ in linked to the alkylene group. However, since OH does not satisfy the conditions (i) and (ii), $Q^1$ is not interrupted by the alkylene group (OH is $Q^1$).

In the present invention, regarding determination of $Q^1$, in a case where the structural part facing with Dye through $L^1$ has an aliphatic ring, the method of determining $Q^1$ described in "another aspect of $Q^1$" has priority even in a case where the structural part has a structure which is bonded to the alkylene group included in In the present invention, the energy levels of HOMO and LUMO of $Q^1$ and the energy levels of HOMO and LUMO of Dye are defined in (i) and (ii). The energy levels of HOMO and LUMO are usually concepts for a compound. In the present invention, the energy levels of HOMO and LUMO of Dye are defined as energy levels of HOMO and LUMO of a compound having a structure assuming, in a case where Dye, $L^1$, and $Q^1$ of the compound are determined based on the above-described rules, that a linking site of Dye to $L^1$ is replaced with a methyl group.

The same applies to $Q^1$, and the energy levels of HOMO and LUMO of $Q^1$ are defined as energy levels of HOMO and LUMO of a compound having a structure assuming that a linking site of $Q^1$ to $L^1$ is replaced with a methyl group.

In the above description, the linking site is replaced with a methyl group, but actually, not only the methyl group, an alkyl group having approximately 1 to 4 carbon atoms, or the like does not affect the values of HOMO and LUMO. That is, instead of replacing the linking site with a methyl group, there is substantially no problem of considering HOMO and LUMO of a compound in which the linking site is replaced, for example, with an ethyl group, a propyl group, or the like as HOMO and LUMO of Dye or $Q^1$.

In the present invention, the energy level difference between HOMO and LUMO of Dye and $Q^1$ can be obtained from an intersection point of a fluorescence spectrum and an absorption spectrum of each compound in which the linking site of Dye and $Q^1$ is replaced with a methyl group.

In addition, each energy level of HOMO and LUMO of Dye can be obtained by measuring, using a cyclic voltammetry, an oxidation potential of a compound in which the linking site of Dye is replaced with a methyl group, defining the obtained value as an energy level of HOMO, and calculating LUMO of Dye from the energy level difference.

In addition, each energy level of HOMO and LUMO of $Q^1$ cart be obtained by measuring, using a cyclic voltammetry, an oxidation potential or a reduction potential of a compound in which the linking site of $Q^1$ is replaced with a methyl group, defining, in a case of measuring the oxidation potential, the obtained value as an energy level of HOMO and defining, in a case of measuring the reduction potential, the obtained value as an energy level of LUMO, and calculating the other energy level from the energy level difference.

Hereinafter, preferred structures of Dye and $Q^1$ in Formula (1) will be described in detail.

Dye in Formula (1)

Dye in Formula (1) represents a colorant structural part consisting of a structure in which n1 hydrogen atoms are removed from the compound represented by Formula (2). The portion where the hydrogen atom is removed is a bonding part with $L^1$.

An aspect of removing hydrogen atoms from Dye is not particularly limited, and the hydrogen atom may be a hydrogen atom (hydrogen atom directly bonded to an atom constituting the ring structure of an aryl group or a heterocyclic group) included in an aryl group or a heterocyclic group which can be adopted as A or B in Formula (2), or may be a hydrogen atom included in a substituent bonded to the aryl group or the heterocyclic group.

Formula (2)

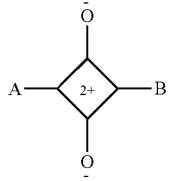

In Formula (2), A and B represent an aryl group, a heterocyclic group, or —CH=G, in which G represents a heterocyclic group.

In Formula (2), A and B may be the same as or different from each other. In addition, A is preferably a heterocyclic group. With such a configuration, the oxidation potential is lower and light resistance is improved.

The aryl group which can be adopted as A or B is not particularly limited, and may be a group formed of a single ring or a group formed of a fused ring. The number of carbon atoms in the aryl group is preferably 6 to 30, more preferably 6 to 20, and still more preferably 6 to 12. Examples of the aryl group include groups formed of a benzene ring or a naphthalene ring, and groups formed of a benzene ring are more preferable.

A heterocyclic group which can be adopted as A or B is not particularly limited, examples thereof include groups formed of an aliphatic hetero ring or an aromatic hetero ring, and groups formed of an aromatic hetero ring are preferable. Examples of a heteroaryl group which is an aromatic heterocyclic group include heteroaryl groups which can be adopted as the substituent X described later. The aromatic heterocyclic group which can be adopted as A or B is preferably a group of a five-membered ring or a six-membered ring and more preferably a group of a nitrogen-containing five-membered ring. Specifically, suitable examples thereof include groups formed of a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, or a pyrazolotriazole ring. Among these, groups formed of a pyrrole ring, a pyrazole ring, a thiazole ring, a pyridine ring, a pyrimidine ring, or a pyrazolotriazole ring are preferable. The pyrazolotriazole ring is formed of a fused ring of a pyrazole ring and a triazole ring, and means a fused ring formed by fusing at least one of each of the rings.

G in —CH=G which can be adopted as A or B represents a heterocyclic group which may have a substituent, and suitable examples thereof include examples listed as A and B. Among these, groups formed of a benzoxazole ring, a benzothiazole ring, or an indoline ring are preferable.

Each of A, B, and G may have a substituent X, and in a case where A, B, or G has the substituent X, adjacent substituents may be bonded to each other to further form a ring structure. In addition, each of A, B, and G may have a plurality of substituents.

Examples of the substituent X include substituents which can be adopted as $R^1$ in Formula (4) described later, and specific examples thereof include a halogen atom, a cyano group, a nitro group, an alkyl group, an alkenyl group, an alkynyl group, an aryl group, a heteroaryl group, an aralkyl group, —$OR^{10a}$, —$COR^{11a}$, —$COOR^{12a}$, —$OCOR^{13a}$, —$NR^{14a}R^{15a}$, —$NHCOR^{16a}$, —$CONR^{17a}R^{18a}$, —$NHCONR^{19a}R^{20a}$, —$NHCOOR^{21a}$, —$SR^{22a}$, —$SO_2R^{23a}$, —$SO_3R^{24a}$, —$NHSO_2R^{25a}$, and —$SO_2NR^{26a}R^{27a}$.

$R^{10a}$ to $R^{27a}$ each independently represent a hydrogen atom, an aliphatic group, an aromatic group, or a heterocyclic group. The aliphatic group and the aromatic group which can be adopted as $R^{10a}$ to $R^{27a}$ are not particularly limited, and can be appropriately selected from the substituents which can be adopted as $R^1$ in Formula (4) described later. Among these, an alkyl group or an alkenyl group is preferable as the aliphatic group, and an aryl group is preferable as the aromatic group. The heterocyclic group which can be adopted as $R^{10a}$ to $R^{27a}$ may be aliphatic or aromatic, and can be appropriately selected from heteroaryl groups or heterocyclic groups which can be adopted as $R^1$ in Formula (4) described later.

In a case where $R^{12a}$ in —$COOR^{12a}$ is a hydrogen atom (that is, a carboxy group), the hydrogen atom may be dissociated (that is, a carbonate group) or may be in a state of salt. In addition, in a case where $R^{24a}$ in —$SO_3R^{24a}$ is a hydrogen atom (that is, a sulfo group), the hydrogen atom may be dissociated (that is, a sulfonate group) or may be in a state of salt.

Examples of the halogen atom which can be adopted as X include a fluorine atom, a chlorine atom, a bromine atom, and an iodine atom.

The number of carbon atoms in the alkyl group which can be adopted as X is preferably 1 to 20, more preferably 1 to 15, and still more preferably 1 to 8. The number of carbon atoms in the alkenyl group is preferably 2 to 20, more preferably 2 to 12, and still more preferably 2 to 8. The number of carbon atoms in the alkynyl group is preferably 2 to 40, more preferably 2 to 30, and particularly preferably 2 to 25. Each of the alkyl group, the alkenyl group, and the alkynyl group may be any of linear, branched, or cyclic, and is preferably linear or branched.

The aryl group includes a group of a single ring or a fused ring. The number of carbon atoms in the aryl group is preferably 6 to 30, more preferably 6 to 20, and still more preferably 6 to 12.

An alkyl portion in the aralkyl group (alkyl-substituted aryl group) is the same as the above-described alkyl group. An aryl portion in the aralkyl group is the same as the above-described aryl group. The number of carbon atoms in the aralkyl group is preferably 7 to 40, more preferably 7 to 30, and still more preferably 7 to 25.

The heteroaryl group includes a group formed of a single ring or a fused ring, and a group formed of a single ring or a fused ring having 2 to 8 rings is preferable and a group formed of a single ring or a fused ring having 2 to 4 rings is more preferable. The number of hetero atoms constituting a ring of the heteroaryl group is preferably 1 to 3. Examples of the hetero atoms constituting the ring of the heteroaryl group include a nitrogen atom, an oxygen atom, and a sulfur atom. The heteroaryl group is preferably a group formed of a five-membered ring or a six-membered ring. The number of carbon atoms constituting the ring of the heteroaryl group is preferably 3 to 30, more preferably 3 to 18, and still more preferably 3 to 12. Examples of the heteroaryl group include groups formed of a pyridine ring, a piperidine ring, a furan ring, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, or a thiadiazole ring.

Each of the alkyl group, the alkenyl group, the alkynyl group, the aralkyl group, the aryl group, and the heteroaryl group exemplified as the examples of the substituent X may further have a substituent or may be unsubstituted. The substituent which may be further included is not particularly limited, but is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthio group, an aromatic heterocyclic thio group, a sulfonyl group, a hydroxy group, a mercapto group, a halogen atom, a cyano group, a sulfo group, and a carboxy group, and more preferably a substituent selected from an alkyl group, an aryl group, an alkoxy group, an aryloxy group, an aromatic heterocyclic oxy group, au acyl group, an alkoxycarbonyl group, an aryloxycarbonyl group, an acyloxy group, an alkylthio group, an arylthio group, an aromatic heterocyclic thio group, a sulfonyl group, a hydroxy group, a mercapto group, a halogen atom, a cyano group, a sulfo group, and a carboxy group. These groups can be appropriately selected from the substituents which can be adopted as $R^1$ in Formula (4) described later.

Examples of a preferred embodiment of the colorant represented by Formula (2) include a colorant represented by Formula (3).

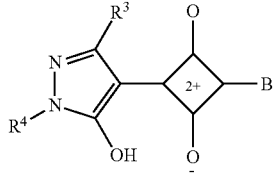

Formula (3)

In Formula (3), $R^3$ and $R^4$ each independently represent a hydrogen atom or a substituent. The substituent which can be adopted as $R^3$ and $R^4$ is not particularly limited, and the same substituent which can be adopted as $R^1$ in Formula (4) described later can be exemplified.

However, the substituent Which can be adopted as $R^3$ is preferably an alkyl group, an alkoxy group, an amino group, an amide group, a sulfonamide group, a cyano group, a nitro group, an aryl group, a heteroaryl group, a heterocyclic group, an alkoxycarbonyl group, a carbamoyl group, or a halogen atom, more preferably an alkyl group, an aryl group, or an amino group, and still more preferably an alkyl group.

The substituent which can be adopted as $R^4$ is preferably an alkyl group, an aryl group, a heteroaryl group, a heterocyclic group, an alkoxy group, an alkoxycarbonyl group, an acyl group, an acyloxy group, an amide group, a carbamoyl group, an amino group, or a cyano group, more preferably an alkyl group, an alkoxycarbonyl group, an acyl group, a carbamoyl group, or an aryl group, and still more preferably an alkyl group.

The alkyl group which can be adopted as $R^3$ and $R^4$ may be linear, branched, or cyclic and is preferably linear or branched.

The number of carbon atoms in the alkyl group which can be adopted as $R^3$ is preferably 1 to 18, more preferably 1 to 12, and most preferably 1 to 6. Examples thereof include methyl, ethyl, n-propyl, isopropyl, t-butyl, 2-methylbutyl, 2-ethylhexyl, t-pentyl, neopentyl, 3,5,5-trimethylhexyl, cyclopentyl, cyclohexyl, hexyl, octyl, 1-cyclohexylethyl, 1-cyclohexylpropyl, dicyclohexylmethyl, decyl, dodecyl, hexyldecyl, and hexyloctyl, and methyl, ethyl, n-propyl, isopropyl, t-butyl, 2-methylbutyl, cyclopentyl, cyclohexyl, or hexyl is preferable.

The number of carbon atoms in the alkyl group which can be adopted as $R^4$ is preferably 1 to 24 and more preferably 3 to 18. Examples of the alkyl group include methyl, ethyl, n-propyl, isopropyl, t-butyl, 2-methylbutyl, 2-ethylhexyl, t-pentyl, neopentyl, 3,5,5-trimethylhexyl, cyclopentyl, cyclohexyl, hexyl, octyl, 1-cyclohexylethyl, 1-cyclohexylpropyl, dicyclohexylmethyl, decyl, dodecyl, hexyldecyl, and hexyloctyl, and isopropyl, t-butyl, t-pentyl, neopentyl, cyclohexyl, dicyclohexylmethyl, or 2-ethylhexyl is preferable.

The alkyl group may further have a substituent, and for example, the substituent include can be arbitrarily selected from the groups which can be adopted as the above-described substituent X.

In Formula (3), B has the same meaning as B in Formula (2).

Examples of a preferred embodiment of the colorant represented by Formula (2) or (3) include a colorant represented by Formula (4).

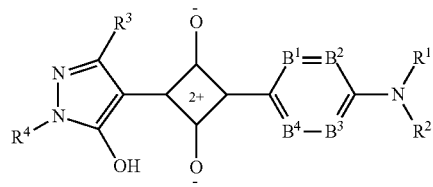

Formula (4)

In Formula (4), $R^1$ and $R^2$ each independently represent a hydrogen atom or a substituent. $R^1$ and $R^2$ may be the same as or different from each other, and may be bonded to each other to form a ring.

The substituent which can be adopted as $R^1$ and $R^2$ is not particularly limited, and examples thereof include alkyl groups (such as a methyl group, an ethyl group, a propyl group, an isopropyl group, a butyl group, a t-butyl group, an isobutyl group, a pentyl group, a hexyl group, an octyl group, a dodecyl group, and a trifluoromethyl group), cycloalkyl groups (such as a cyclopentyl group and a cyclohexyl group), alkenyl groups (such as a vinyl group and an allyl group), alkynyl groups (such as an ethynyl group and a propargyl group), aryl groups (such as a phenyl group and a naphthyl group), heteroaryl groups (such as a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a benzothiazolyl group, a quinazolyl group, and a phthalazyl group), heterocyclic groups (such as a pytrolidyl group, an imidazolidyl group, a morpholyl group, and an oxazolidyl group), alkoxy groups (such as a methoxy group, an ethoxy group, and a propyloxy group), cycloalkoxy groups (such as a cyclopentyloxy group and a cyclohexyloxy group), aryloxy groups (such as a phenoxy group and a naphthyloxy group), heteroaryloxy groups (aromatic heterocyclic oxy group), alkylthio groups (such as a methylthio group, an ethylthio group, and a propylthio group), cycloalkylthio groups (such as a cyclopentylthio group and a cyclohexylthio group), arylthio groups (such as a phenylthio group and a naphthylthio group), heteroarylthio groups (aromatic heterocyclic thio group), alkoxycarbonyl groups (such as methyloxycarbonyl group, an ethyloxycarbonyl group, a butyloxycarbortyl group, and an octyloxycarbonyl group), aryloxycarbonyl groups (such as a phenyloxycarbonyl group and a naphthyloxycarbonyl group), phosphoryl groups (such as dimethoxyphosphoryl and diphenylphosphoryl), sulfamoyl groups (such as an aminosulfonyl group, a methylaminosulfonyl group, a dimesthylaminosulfonyl group, a butylaminosulfonyl group, a cyclohexylaminosulfonyl group, an octylaminosulfonyl group, a phenylaminosulfonyl group, and a 2-pyridylaminosulfonyl group), acyl groups (such as an acetyl group, an ethylcarbonyl group, a propylcarbonyl group, a cyclohexylcarbanyl group, an octylcarbonyl group, a 2-ethylhexylcarbonyl group, a phenylcarbonyl group, a naphthylcarbonyl group, and a pyridylcarbonyl group), acyloxy groups (such as an acetyloxy group, an ethylcarhonyloxy group, a butylcarbonyloxy group, an octylcarbonyloxy group, and a phenylcarbonyloxy group), acylamino groups (such as an acetylamino group, an ethylcarbonylamino group, a butylcarbonylamino group, an octylcarbonylamino group, and a phenylcarbonylamino group), amide groups (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarhonylamino group), sulfonylamide groups (such as a methylsulfonylamino group, an octylsulfonylamino group, a 2-ethylhexylsulfonylamino group, and a trifluoromethylsulfonylamino group), carbamoyl groups (such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), ureido groups (such as a methylureido group, an ethylureido group, a pentylureido group, a cyclohexylureido group, an octylureido group, a dodecylureido group, a phenylureido group, a naphthylureido group, and a 2-pyridylaminoureido group), alkylsulfonyl groups (such as a methylsulfonyl group, an ethylsulfonyl group, a butylsulfonyl group, a cyclohexylsulfonyl group, and a 2-ethylhexylsulfonyl group), arylsulfonyl groups (such as a phenylsulfonyl group, a naphthylsulfonyl group, and a 2-pyridylsulfonyl group), amino groups (such as an amino group, an ethylamino group, a dimethylamino group, a butylamino group, a dibutylamino group, a cyclopentylamino group, a 2-ethylhexylamino group, a dodecylamino group, an anilino group, a naphthylamino group, and a 2-pyridylamino group), alkylsulfonyloxy groups (methanesulfonyloxy group), a cyano group, a nitro group, halogen atoms (such as a fluorine atom, a chlorine atom, and a bromine atom), a hydroxy group, a sulfo group, and a carboxy group.

Among these, an alkyl group, an alkenyl group, an aryl group, or a heteroaryl group is preferable, an alkyl group, an aryl group, or a hetero aryl group is more preferable, and an alkyl group is still more preferable.

The substituent which can be adopted as $R^1$ and $R^2$ may further have a substituent. Examples of the substituent which may be further included include the above-described substituents which can be adopted as $R^1$ and $R^2$. In addition, $R^1$ and $R^2$ may be bonded to each other or may be bonded with a substituent which is included in $B^2$ or $B^3$ to form a ring. As the ring formed at this time, a hetero ring or a heteroaryl ring is preferable. The size of the ring formed is not particularly limited, but a five-membered ring or a six-membered ring is preferable.

In Formula (4), $B^1$, $B^2$, $B^3$, and $B^4$ each independently represent a carbon atom or a nitrogen atom. The ring including $B^1$, $B^2$, $B^3$, and $B^4$ is an aromatic ring. It is preferable that at least two or more of $B^1$ to $B^4$ are carbon atoms, and it is more preferable that all of $B^1$ to $B^4$ are carbon atoms.

The carbon atom which can be adopted as $B^1$ to $B^4$ has a hydrogen atom or a substituent. Among carbon atoms which can be adopted as $B^1$ to $B^4$, the number of carbon atoms having a substituent is not particularly limited, but is preferably 0, 1, or 2 and more preferably 1. In particular, it is preferable that $B^1$ and $B^4$ are carbon atoms and at least one has a substituent.

The substituent included in the carbon atom which can be adopted as $B^1$ to $B^4$ is not particularly limited, and examples thereof include the above-described substituents which can be adopted as $R^1$ and $R^2$. Among these, an alkyl group, an alkoxy group, an alkoxycarbonyl group, an aryl group, an acyl group, an amide group, an acylamino group, a sulfonylamide group, a carbamoyl group, an alkylsulfonyl group, an arylsulfonyl group, an amino group, a cyano group, a nitro group, a halogen atom, or a hydroxy group is preferable, and an alkyl group, an alkoxy group, an alkoxycarbonyl group, an aryl group, an acyl group, an amide group, an acylamino group, a sulfonylamide group, a carbamoyl group, an amino group, a cyano group, a nitro group, a halogen atom, or a hydroxy group is more preferable.

As the substituent included in the carbon atom which can be adopted as $B^1$ and $B^4$, an alkyl group, an alkoxy group, a hydroxy group, an amide group, an acylamino group, a sulfonylamide group, or a carbamoyl group is still more preferable, and an alkyl group, an alkoxy group, a hydroxy group, an amide group, an acylamino group, or a sulfonylamide group is particularly preferable, and a hydroxy group, an amide group, or a sulfonylamide group is most preferable.

As the substituent included in the carbon atom which can be adopted as $B^2$ and $B^3$, an alkyl group, an alkoxy group, an alkoxycarbonyl group, an acyl group, an amino group, a cyano group, a nitro group, or a halogen atom is still more preferable, and it is particularly preferable that the substituent in any one of $B^2$ or $B^3$ is an electron-withdrawing group (for example, an alkoxycarbonyl group, an acyl group, a cyano group, a nitro group, or a halogen atom).

In Formula (4), $R^3$ and $R^4$ each independently represent a hydrogen atom or a substituent, and have the same meaning as $R^3$ and $R^4$ in Formula (3).

As the squarylium compound used in the present invention, a squarylium colorant represented by any of Formula (2), further Formula (3) or Formula (4) can be used without particular limitation. Examples thereof include compounds described in JP2006-160618A, WO2004/005981A, WO2004/007447A, Dyes and Pigment, 2001, 49, pp. 161 to 179, WO2008/090757A, WO2005/121098A, and JP2008-275726A.

Hereinafter, preferred specific examples of the colorant represented by Formula (2) will be shown. However, the present invention is not limited thereto.
In the following specific examples, Me represents methyl, Et represents ethyl, and Ph represents phenyl, respectively.
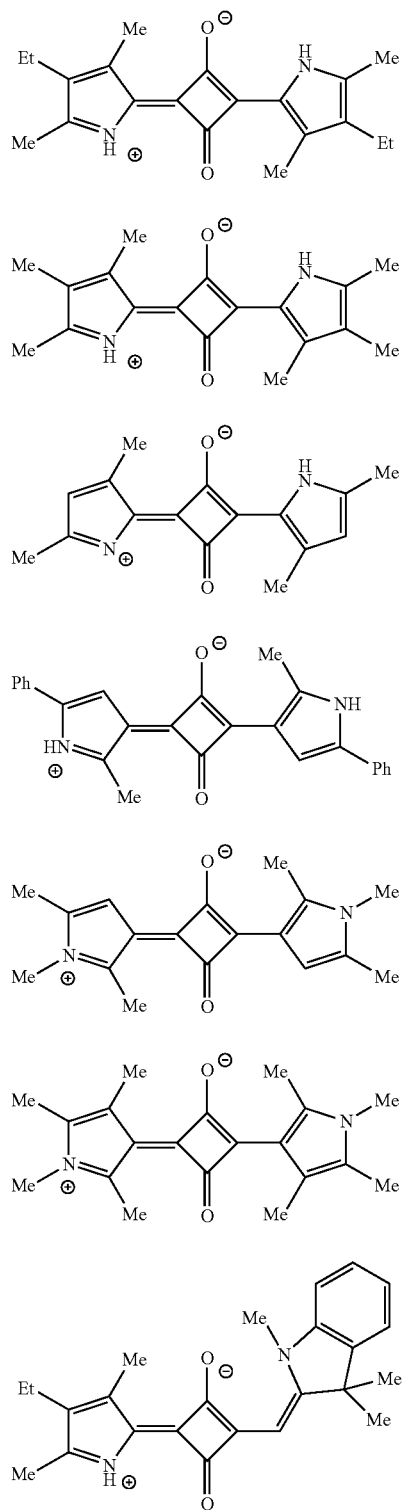
2-1
2-2
2-3
2-4
2-5
2-6
2-7
-continued
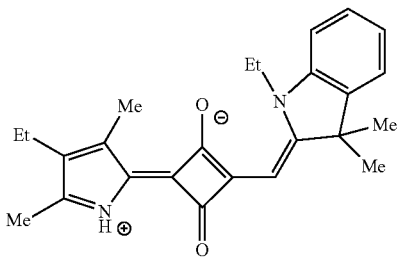
2-8
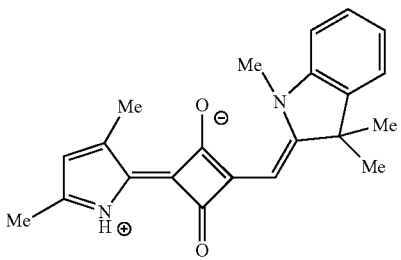
2-9
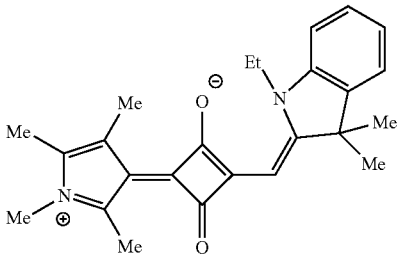
2-10
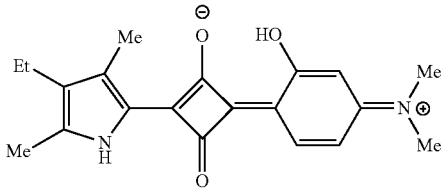
2-11
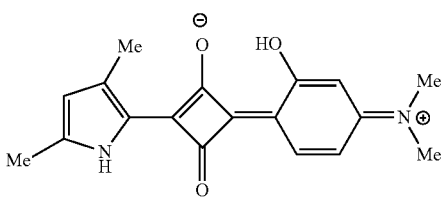
2-12
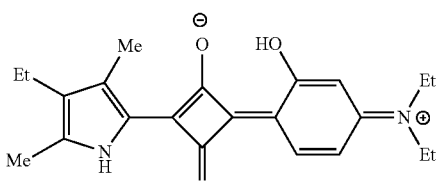
2-13
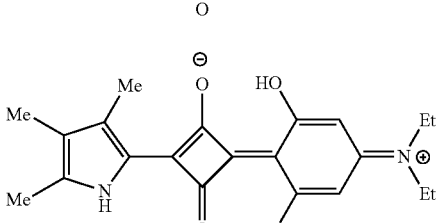
2-14

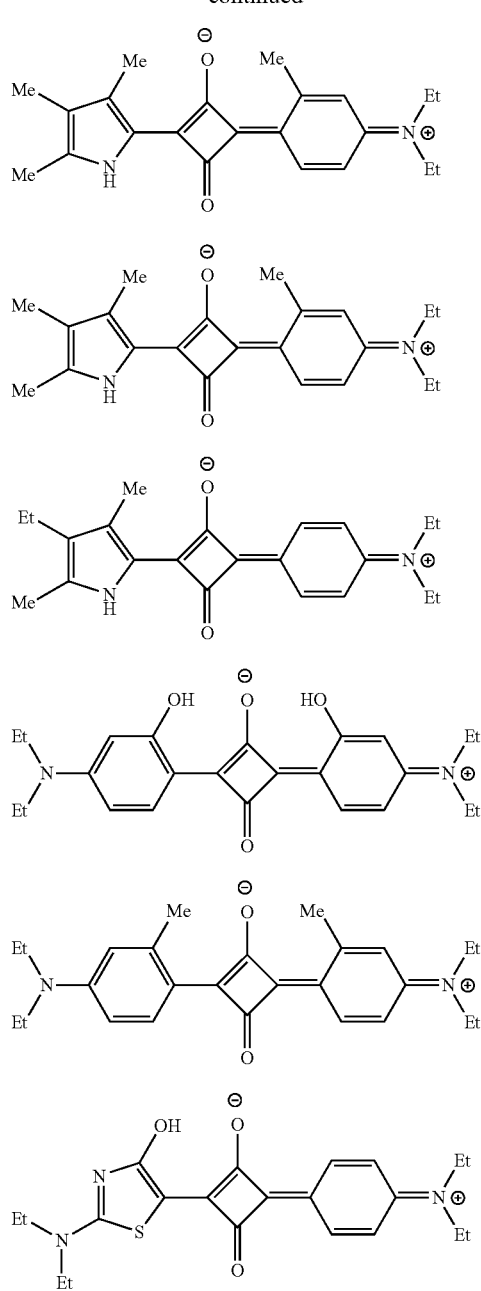

In addition to the above-shown specific examples, specific examples of the colorant represented by Formula (2) will be shown. In the following tables, substituents Bs represent the following structures. In the following structures and the following tables, Me represents methyl, Et represents ethyl, i-Pr represents i-propyl, Bu represents n-butyl, t-Bu represents t-butyl, and Ph represents phenyl, respectively. In the following structures, * indicates a bonding part with a four-membered carbon ring in each formula.

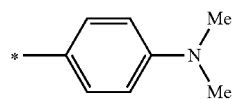
Bs-1

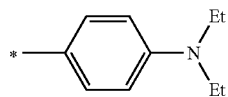
Bs-2

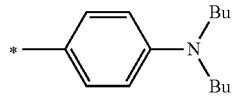
Bs-3

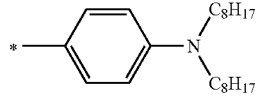
Bs-4

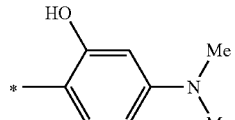
Bs-5

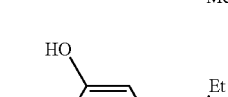
Bs-6

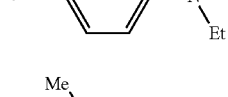
Bs-7

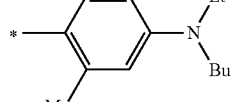
Bs-8

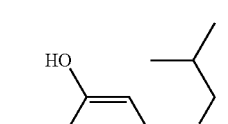
Bs-9

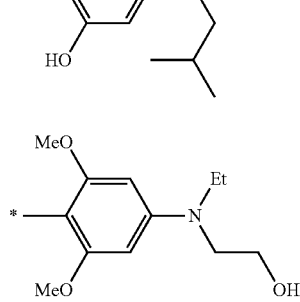
Bs-10

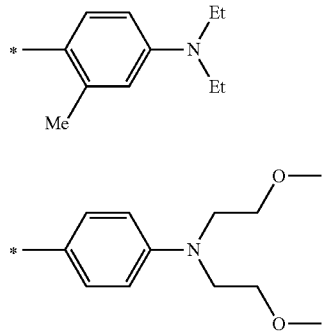
Bs-11

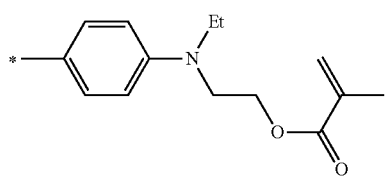
Bs-12
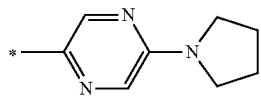
Bs-13
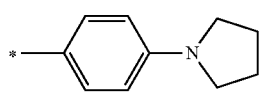
Bs-14
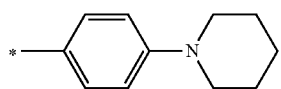
Bs-15
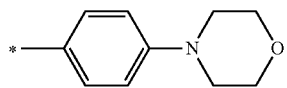
Bs-16
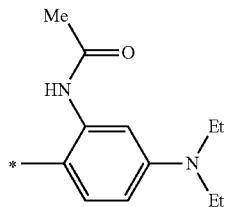
Bs-17
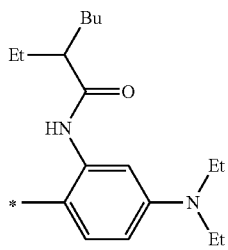
Bs-18
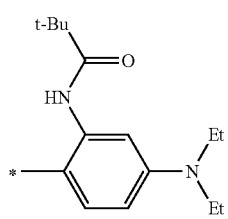
Bs-19
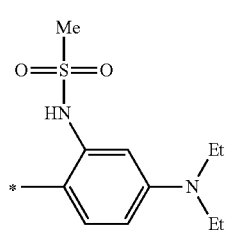
Bs-20
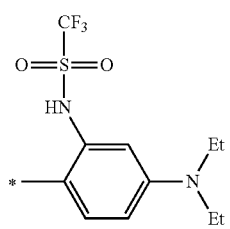
Bs-21
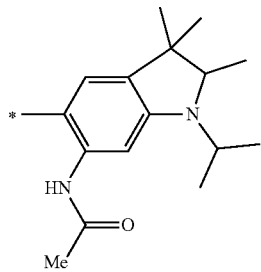
Bs-22
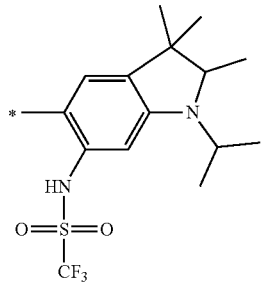
Bs-23
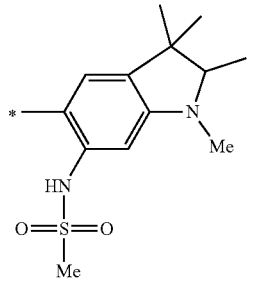
Bs-24
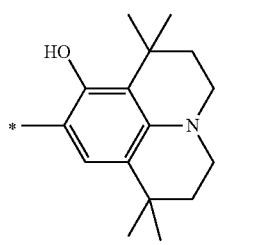
Bs-25
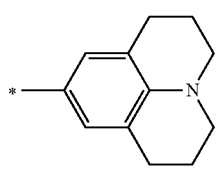
Bs-26

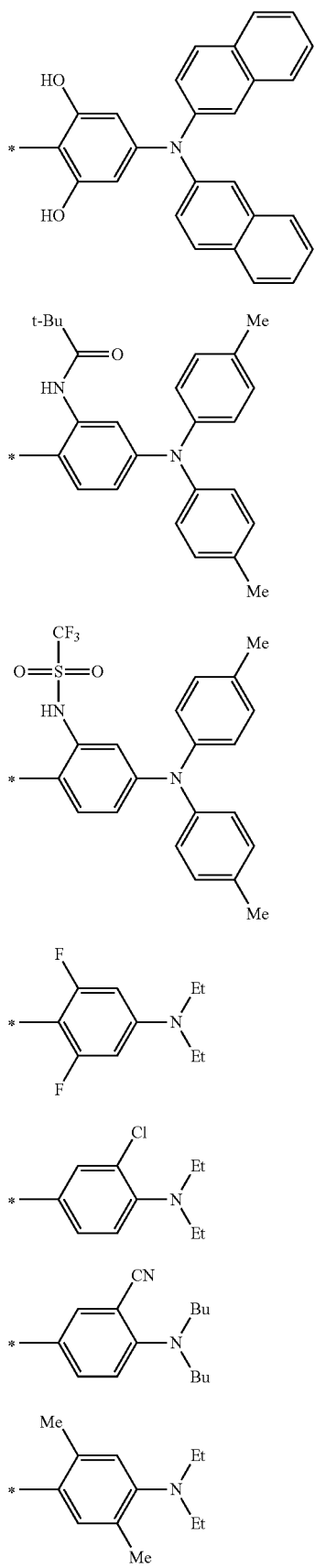
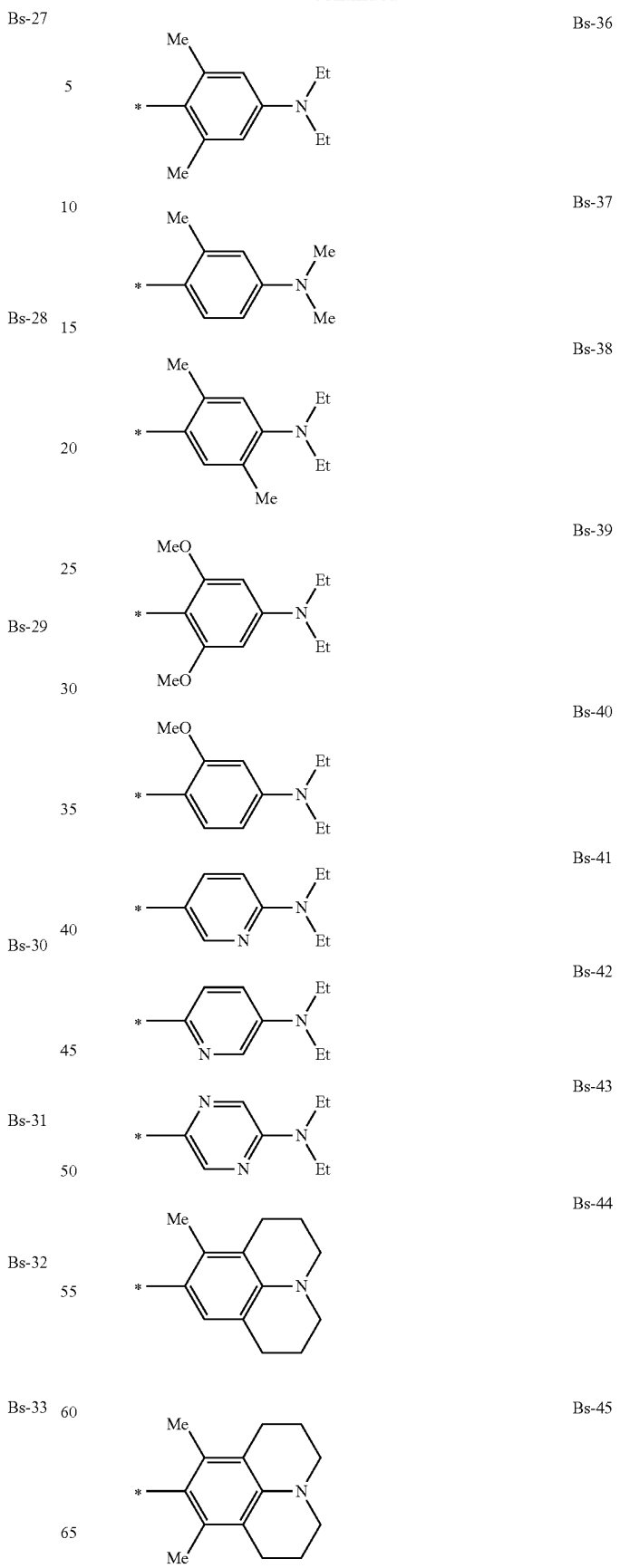

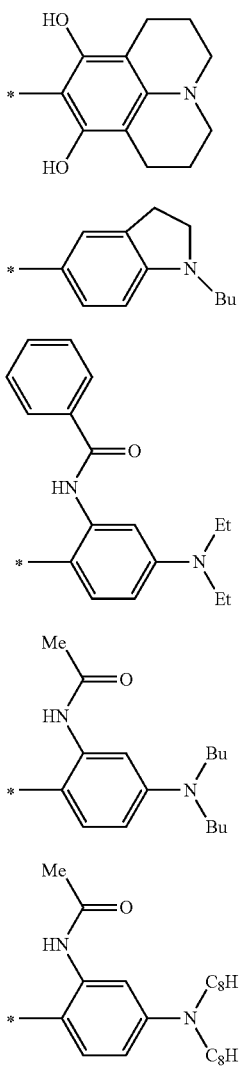

| Compound No. | R³ | R⁴ | B |
|---|---|---|---|
| 3-1 | Me | Me | Bs-3 |
| 3-2 | Me | Me | Bs-4 |
| 3-3 | Me | Me | Bs-5 |
| 3-4 | Me | Me | Bs-10 |
| 3-5 | Me | Me | Bs-14 |
| 3-6 | Me | Me | Bs-16 |
| 3-7 | Me | Me | Bs-17 |
| 3-8 | Me | Me | Bs-18 |
| 3-9 | Me | Me | Bs-19 |
| 3-10 | Me | Me | Bs-20 |
| 3-11 | Me | Me | Bs-21 |
| 3-12 | Me | Me | Bs-22 |
| 3-13 | Me | Me | Bs-23 |
| 3-14 | Me | Me | Bs-26 |
| 3-15 | Me | Me | Bs-32 |
| 3-16 | Me | Me | Bs-33 |
| 3-17 | Me | Me | Bs-38 |
| 3-18 | Me | Me | Bs-49 |
| 3-19 | Et | 2-pyridyl | Bs-28 |
| 3-20 | Me | 4-methyl-6-hydroxypyrimidin-2-yl | Bs-29 |
| 3-21 | H | H | Bs-23 |
| 3-22 | Et | t-Bu | Bs-21 |
| 3-23 | t-Bu | Me | Bs-18 |
| 3-24 | CF₃ | i-Pr | Bs-12 |
| 3-25 | COOEt | Et | Bs-6 |
| 3-26 | CN | Ph | Bs-11 |
| 3-27 | NMe₂ | Me | Bs-2 |
| 3-28 | i-Pr | Me | Bs-17 |
| 3-29 | OEt | Bu | Bs-27 |
| 3-30 | NH₂ | i-Pr | Bs-9 |
| 3-31 | t-Bu | Me | Bs-17 |
| 3-32 | t-Bu | Bu | Bs-21 |
| 3-33 | CF₃ | Me | Bs-18 |
| 3-34 | OEt | Et | Bs-33 |
| 3-35 | NMe₂ | i-Pr | Bs-2 |
| 3-36 | Et | Me | Bs-17 |
| 3-37 | Bu | Me | Bs-18 |
| 3-38 | NH₂ | Ph | Bs-19 |
| 3-39 | OEt | 2,4,6-trichlorophenyl | Bs-25 |
| 3-40 | Me | benzothiazol-2-yl | Bs-2 |
| 3-41 | Me | Ph | Bs-17 |
| 3-42 | Me | Ph | Bs-21 |
| 3-43 | Me | Ph | Bs-36 |
| 3-44 | Me | t-Bu | Bs-17 |
| 3-45 | Me | t-Bu | Bs-18 |
| 3-46 | Me | t-Bu | Bs-10 |
| 3-47 | OEt | Me | Bs-17 |
| 3-48 | OEt | Me | Bs-10 |
| 3-49 | Me | 2,4,6-trichlorophenyl | Bs-17 |

| Compound No. | R³ | R⁴ | B |
|---|---|---|---|
| 3-50 | Me | 3,4-dichlorophenyl | Bs-19 |
| 3-51 | Me | 3,4-dichlorophenyl | Bs-21 |
| 3-52 | Me | 3,4,5-trimethylphenyl | Bs-17 |
| 3-53 | Me | 3,4,5-trimethylphenyl | Bs-20 |
| 3-54 | Me | 3,4,5-trimethylphenyl | Bs-21 |
| 3-55 | t-Bu | Me | Bs-17 |
| 3-56 | t-Bu | Me | Bs-10 |
| 3-57 | t-Bu | Me | Bs-44 |
| 3-58 | t-Bu | t-Bu | Bs-17 |
| 3-59 | t-Bu | t-Bu | Bs-10 |
| 3-60 | t-Bu | t-Bu | Bs-6 |
| 3-61 | NBu₂ | Me | Bs-17 |
| 3-62 | NBu₂ | Me | Bs-10 |
| 3-63 | t-Bu | 3,4-dichlorophenyl | Bs-17 |
| 3-64 | t-Bu | 3,4-dichlorophenyl | Bs-19 |
| 3-65 | t-Bu | 3,4-dichlorophenyl | Bs-21 |
| 3-66 | t-Bu | 3,4,5-trimethylphenyl | Bs-17 |
| 3-67 | t-Bu | 3,4,5-trimethylphenyl | Bs-20 |
| 3-68 | t-Bu | 3,4,5-trimethylphenyl | Bs-21 |

In addition to the above-described compounds, examples of the squarylium compound used in the present invention include compounds (compounds in which a hydrogen atom is added instead of $L^1$) derived from the squarylium colorant structural part included in the exemplary compounds described later, which is represented by Formula (1), and compounds described in JP2002-097383A and JP2015-068945A.

$Q^1$ in Formula (1)

A preferred structure of $Q^1$ in Formula (1) is a structural portion consisting of a structure obtained by removing one hydrogen atom from a compound represented by any one of Formulae (5) to (13). The portion where the hydrogen atom is removed is a bonding part with $L^1$.

An aspect of removing a hydrogen atom from the compound represented by each following formula is not particularly limited, and the hydrogen atom may be a hydrogen atom which can be adopted as reference R ($R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$) of each formula, or may be a hydrogen atom included in each substituent which can be further included in $R^5$ to $R^{27}$, $R^{30}$ to $R^{36}$, $R^{37a}$ to $R^{37e}$, and $R^{38}$ to $R^{42}$.

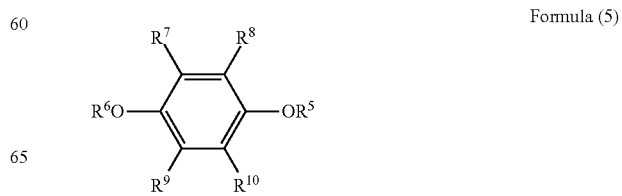

Formula (5)

-continued

Formula (6)

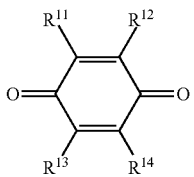

Formula (7)

Formula (8)

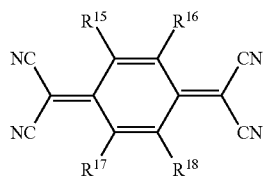

Formula (9)

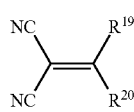

Formula (10)

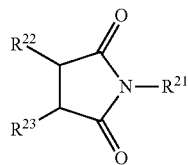

Formula (11)

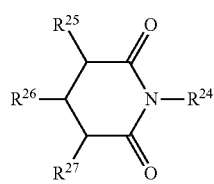

Formula (12)

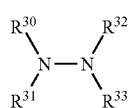

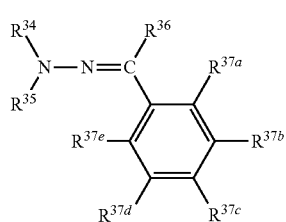

Formula (13)

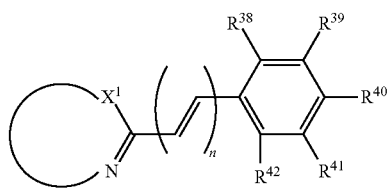

In each formula, $R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$ each independently represent a hydrogen atom or a substituent. The substituent which can be respectively adopted as $R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$ is not particularly limited, and examples thereof include each group described in the substituent which can be adopted as $R^1$ in Formula (4). Among these, an alkyl group, an alkenyl group, an aryl group, a heteroaryl group, a heterocyclic group, arm alkoxy group, a cycloalkoxy group, an aryloxy group, an alkylthio group, a cycloalkylthio group, an arylthio group, a hydroxy group, an amino group, a halogen atom, an acyl group, an acyloxy group, an acylamino group, a cyano group, a sulfo group, or a carboxy group is preferable.

$R^{21}$ and $R^{24}$ each independently represent a hydrogen atom, an alkyl group, an aryl group, or a heterocyclic group. Here, in a case where $R^{21}$ and $R^{24}$ are hydrogen atoms, $Q^1$ is bonded to the linking group $L^1$ at a nitrogen atom position from which the hydrogen atom has been removed.

The alkyl group and aryl group which can be adopted as $R^{21}$ and $R^{24}$ have the same meaning as the alkyl group and aryl group which can be adopted as $R^1$ in Formula (4). The heterocyclic group which can be adopted as $R^{21}$ and $R^{24}$ includes a heteroaryl group and a heterocyclic group, and these groups have the same meaning as the heteroaryl group and heterocyclic group which can be adopted as $R^1$.

In Formula (13), $X^1$ represents an oxygen atom, a sulfur atom, or a carbon atom. In the compound represented by Formula (13), the curve connecting $-X^1$ and N represents an atom group forming a ring with $-X^1-C=N-$. The atom group is not particularly limited, but is composed of, as a ring-constituting atom, a carbon atom, a nitrogen atom, a sulfur atom, and the like, and hydrogen atoms or the like bonded to these atoms. In the compound represented by Formula (13), the ring, composed of the $-X^1-C=N-$ group include an aliphatic hetero ring and an aromatic hetero ring, and may be a single ring or a fused ring. The number of ring members of the single ring or the fused ring which can be adopted as the ring composed of the $-X^1-C=N-$ group is not particularly limited, and is, for example, 5 to 7 and preferably 5 or 6. The ring composed of the $-X^1-C=N-$ group is not particularly limited, and examples thereof include the ring forming a heterocyclic group and the ring forming a heteroaryl group, which can be adopted as $R^1$ in Formula (4). Among these, the ring forming a heteroaryl group is preferable and a 2-benzothiazole ring is more preferable.

n represents an integer of 1 to 3 and is preferably 1.

$R^5$ to $R^{27}$, $R^{30}$ to $R^{36}$, $R^{37a}$ to $R^{37e}$, and $R^{38}$ to $R^{42}$ may be bonded to each other, in a case of being adjacent to each other, to form a ring.

Hereinafter, specific examples of the compound represented by Formula (1) will be shown. However, the present invention is not limited thereto.

In the following specific examples, Me represents methyl and Et represents ethyl, respectively.

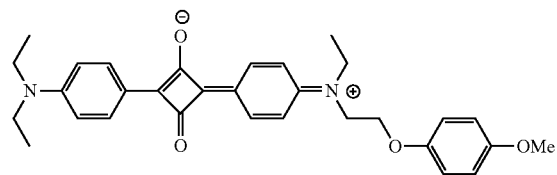
A-1
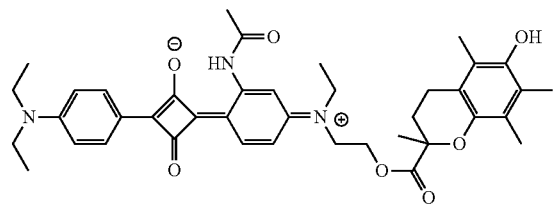
A-2
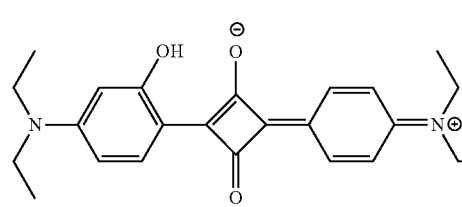
A-3
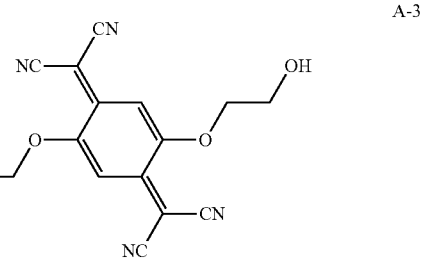
A-4
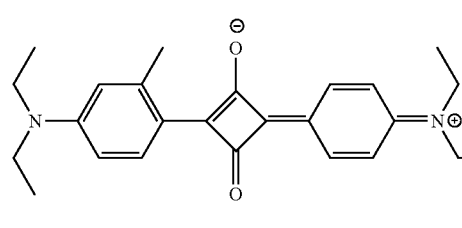
A-5
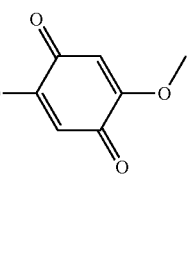
A-6
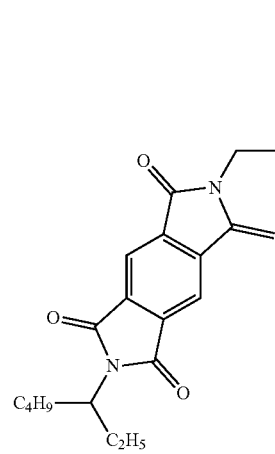
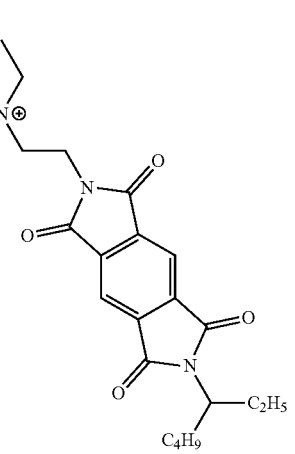
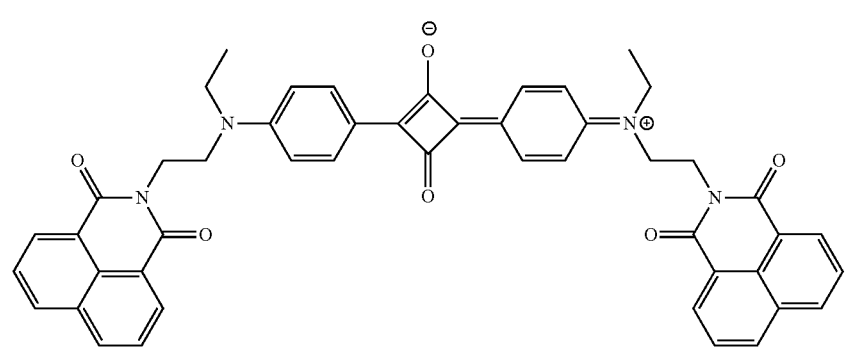

-continued
A-7
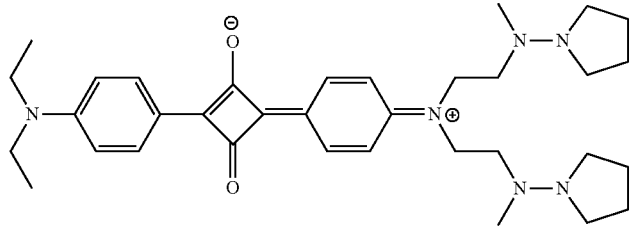
A-8
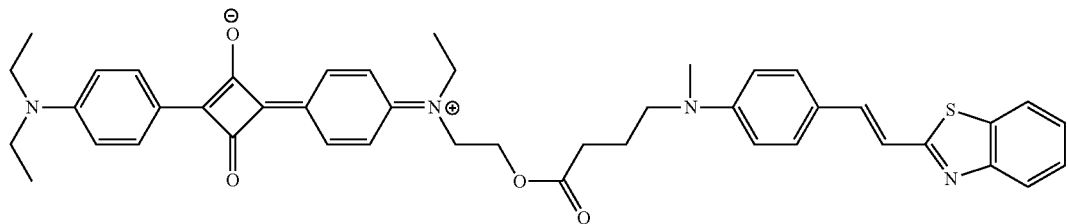
A-9
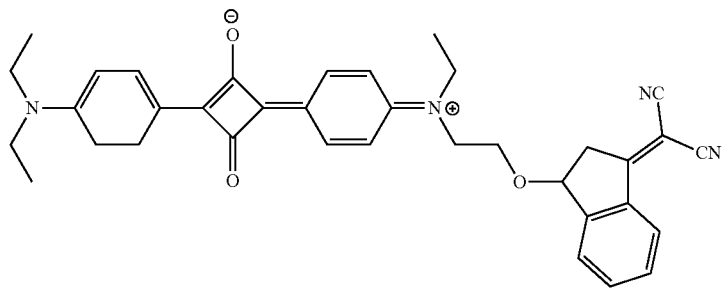
A-10
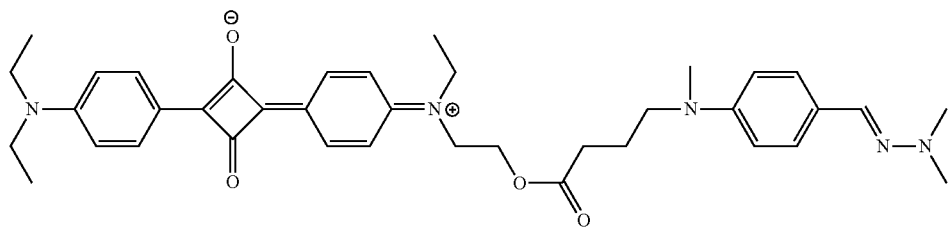
A-11
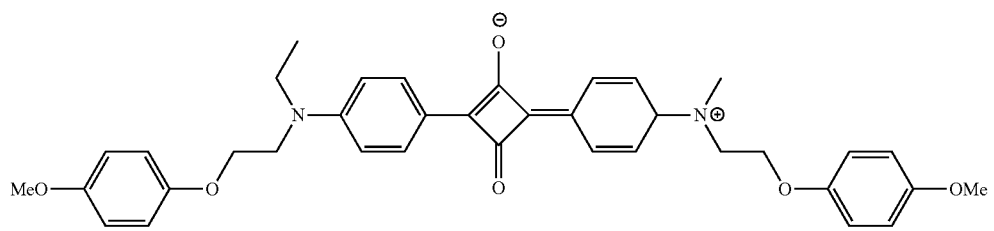
A-12
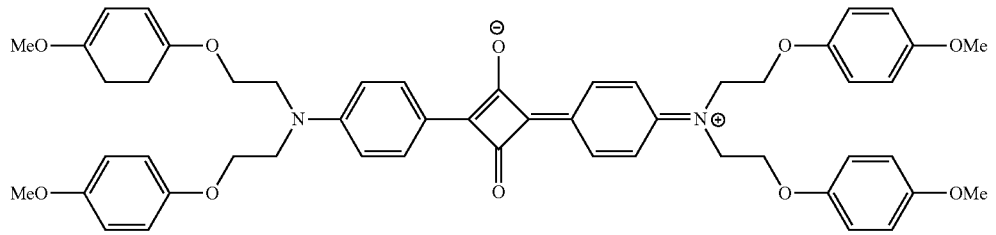

-continued
A-13
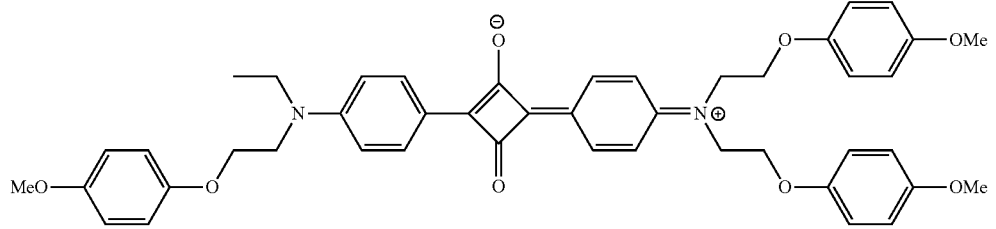
A-14
A-15
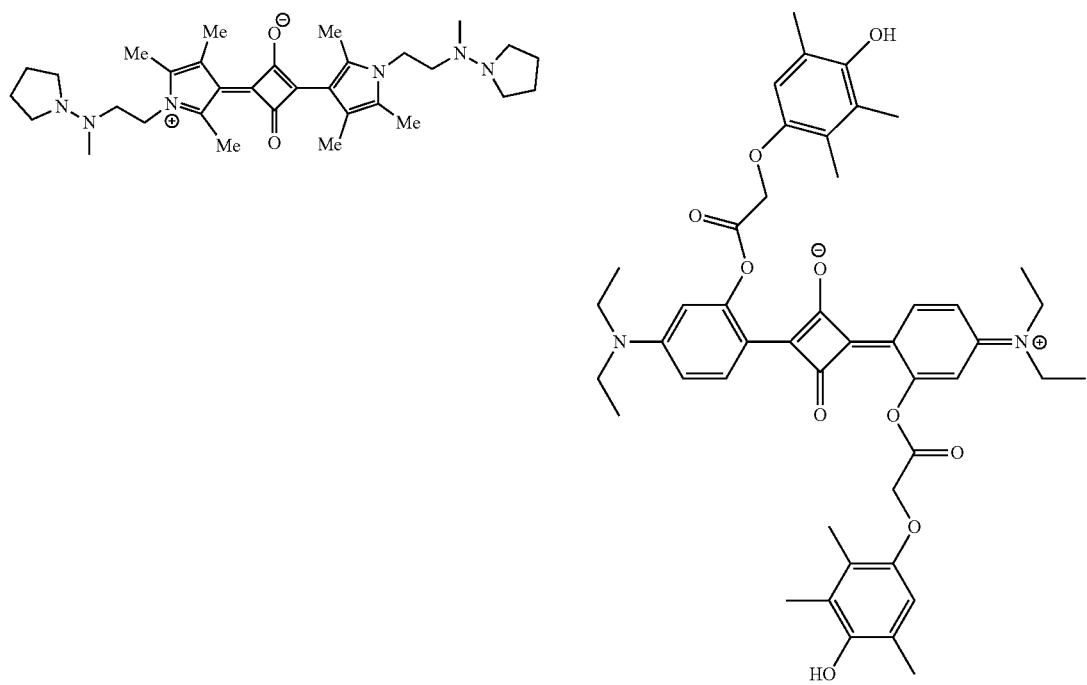
A-16
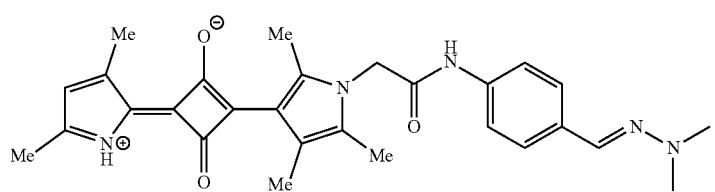
A-17
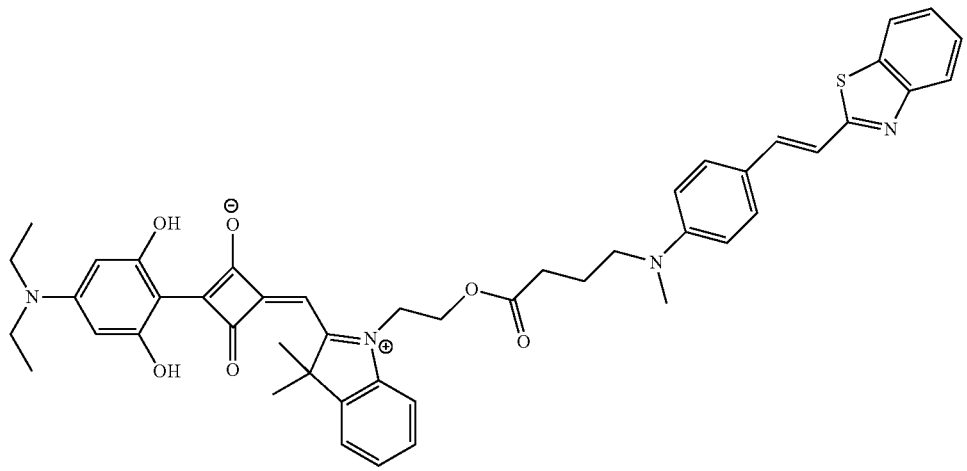

-continued
A-18
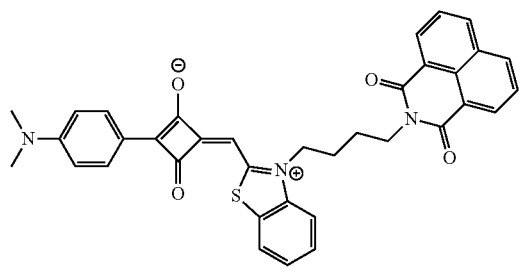
A-19
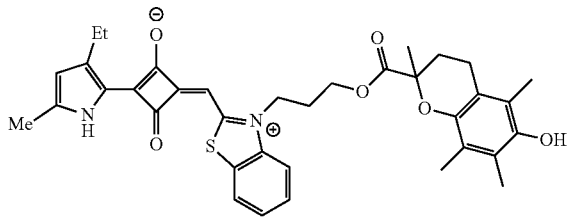
B-1
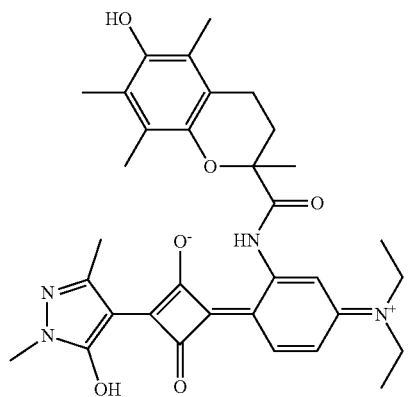
B-2
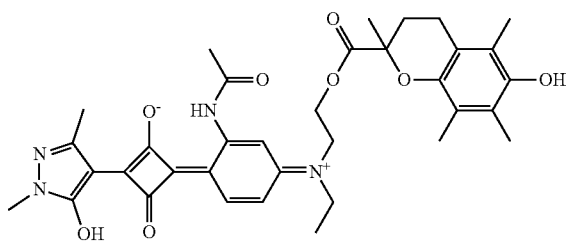
B-3
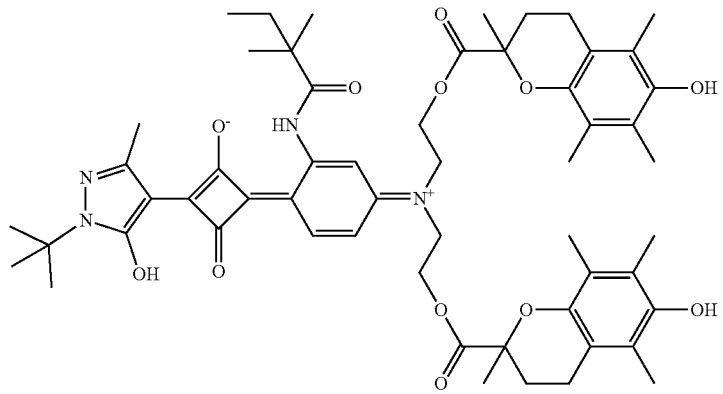
B-4
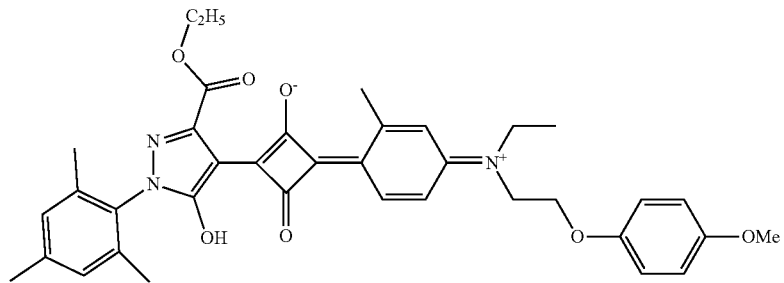

B-5
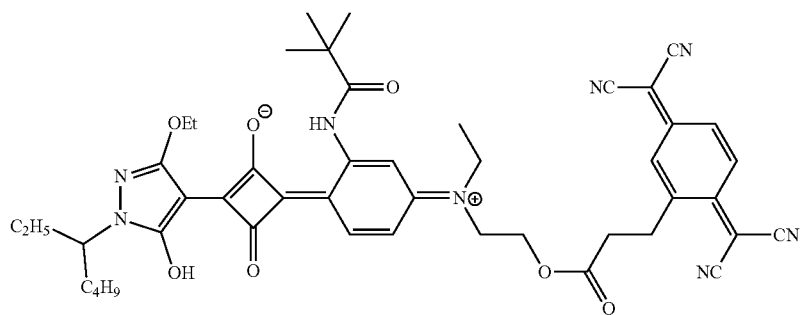
B-6
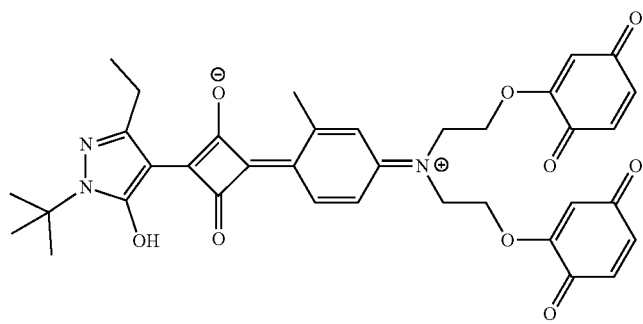
B-7
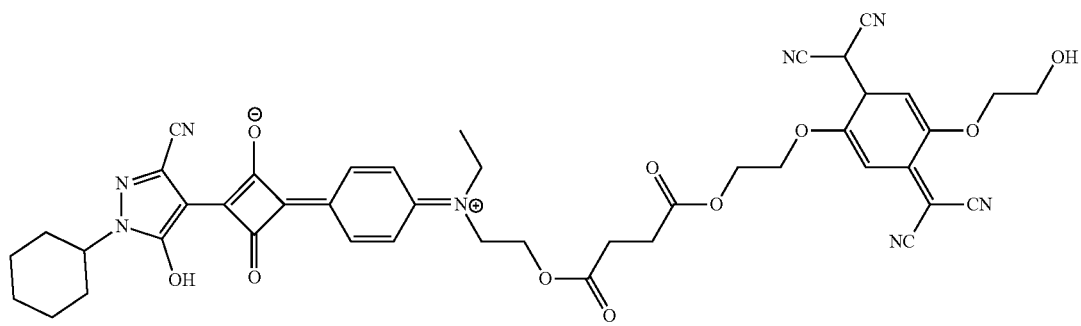
B-8
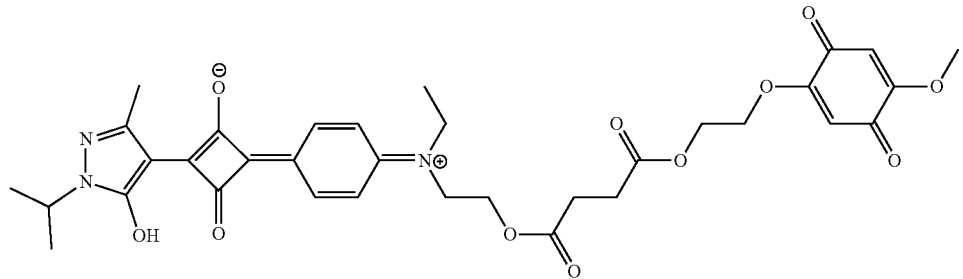

-continued
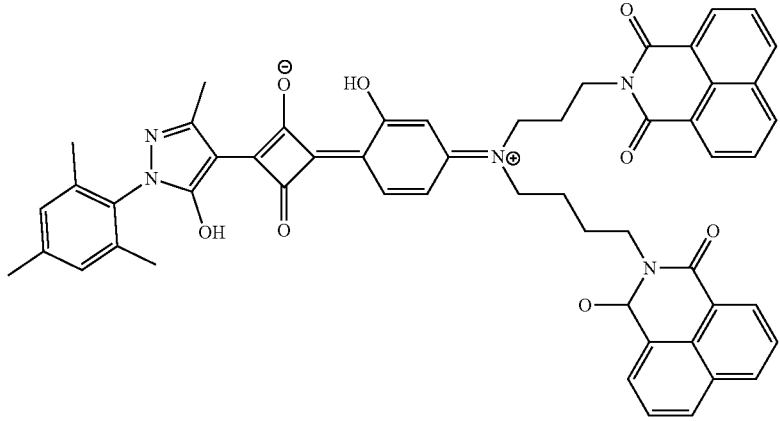
B-9
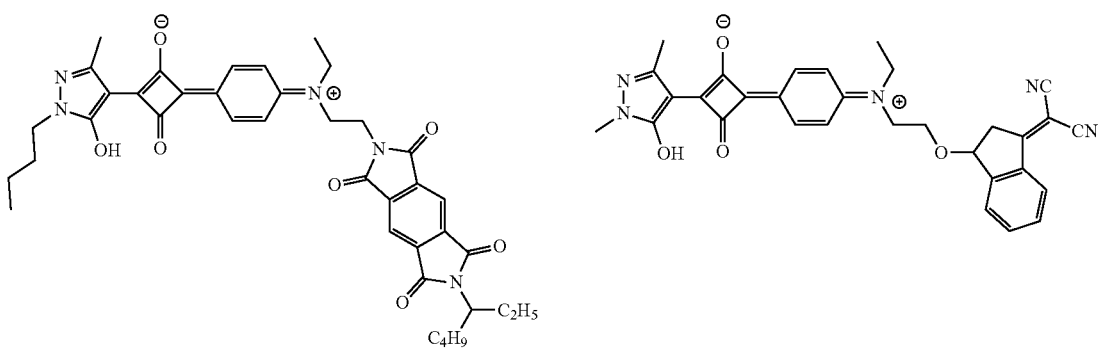
B-10
B-11
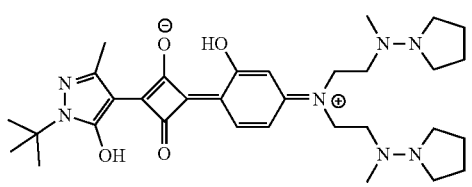
B-12
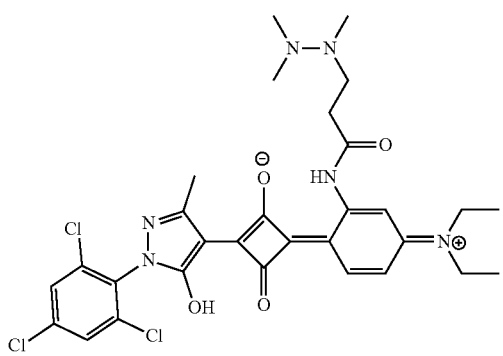
B-13
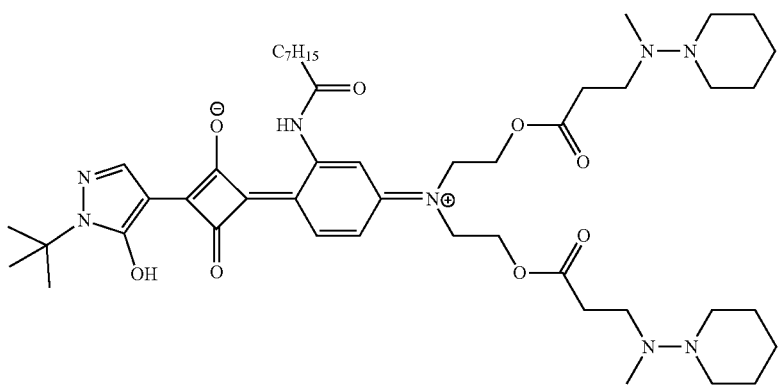
B-14

-continued
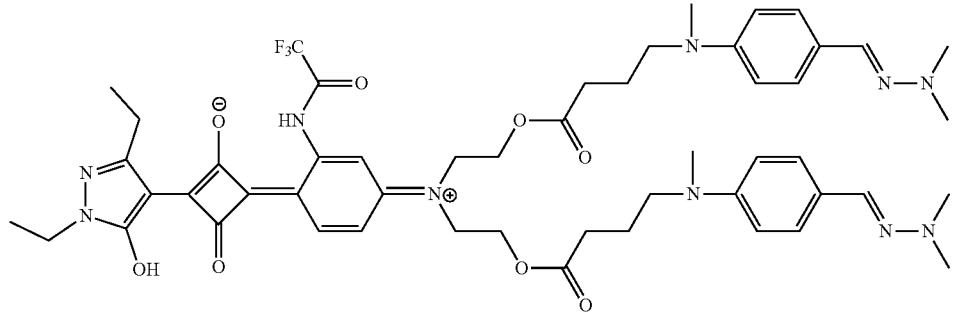
B-15
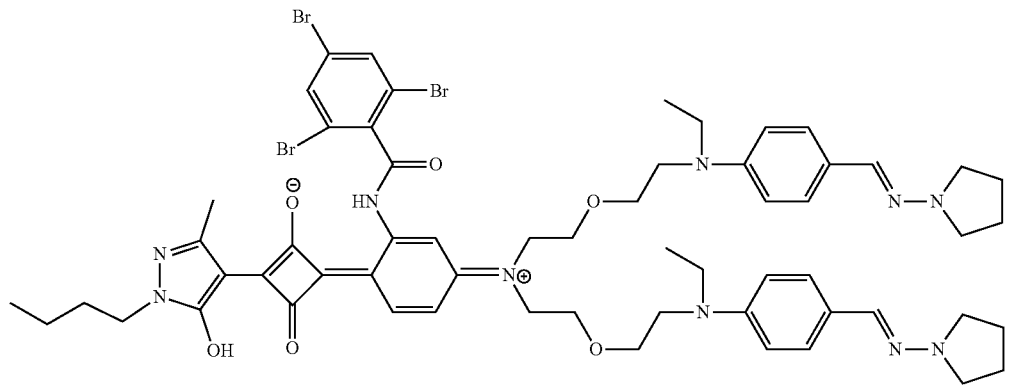
B-16
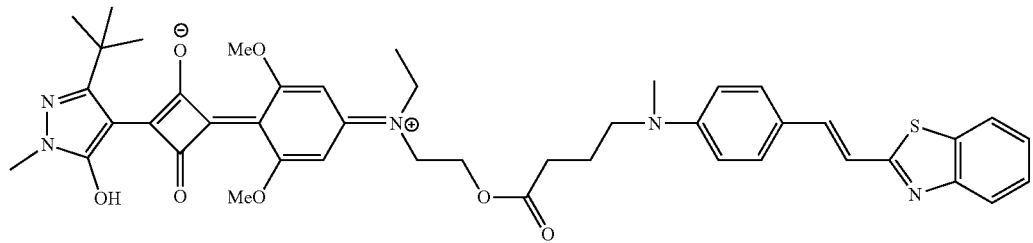
B-17
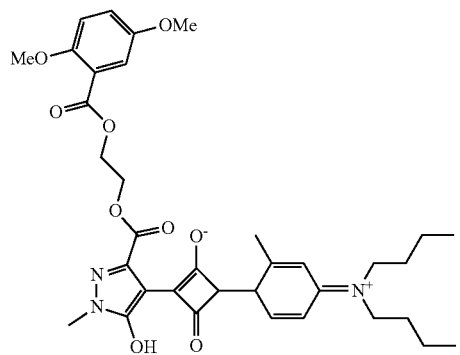
B-18
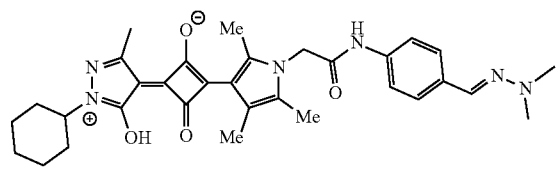
B-19

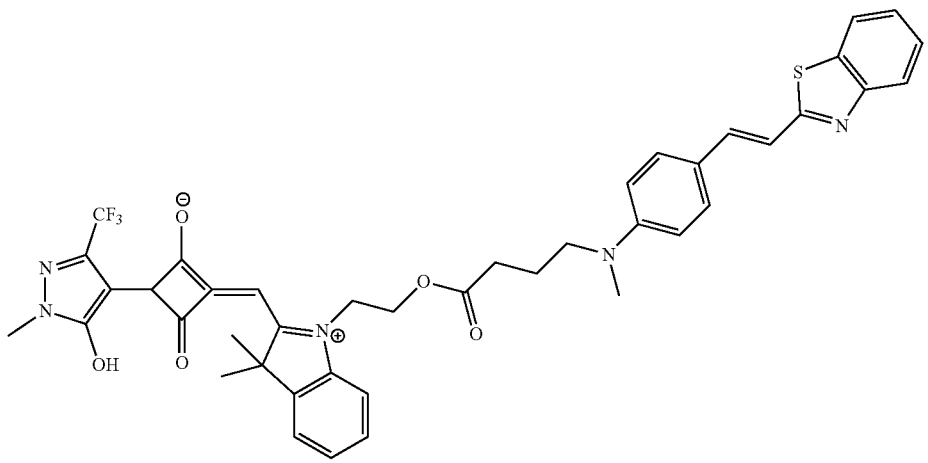
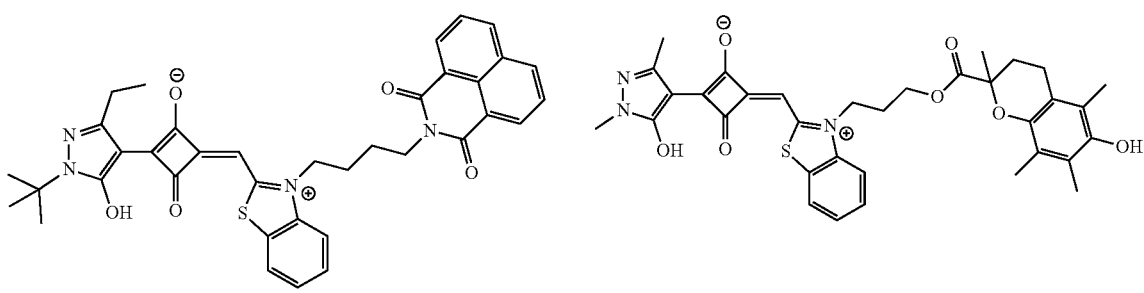
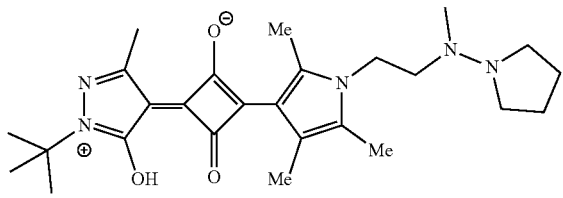

The compound represented by Formula (1) can be synthesized by a known method, and can be synthesized, for example, according to the synthetic method described in Examples described later.

The content of the compound represented by Formula (1), which is used in the resin composition according to the embodiment of the present invention, is preferably 0.005 parts by mass to 5 parts by mass, more preferably 0.01 parts by mass to 3 parts by mass, and still more preferably 0.1 parts by mass to 1.5 parts by mass with respect to 100 parts by mass of the binder resin described later.

In a case where an optical filter includes two or more kinds of colorants, the above-described content is the total content thereof.

In a case where the optical filter according to the embodiment of the present invention also serves as a polarizing plate protective film or a pressure-sensitive adhesive layer which will be described later, it is sufficient that the content of the compound represented by Formula (1) is within the above-described range.

Resin

The resin composition according to the embodiment of the present invention contains a resin (hinder) (binder may include any conventional component in addition to a polymer; hereinafter, may be referred to as a "binder resin"). The resin used in the present invention is preferably transparent. Here, the transparent resin refers to a resin having total light transmittance, measured by forming a 1 mm-thick test piece, of usually 70% or more, preferably 80% or more, and more preferably 90% or more. Examples of the resin used as a binder of the resin composition according to the embodiment of the present invention include a polystyrene resin, a cycloolefin-based resin, a cellulose acylate resin, and an acrylic resin, in which usual resins used as an optical filter can be applied. Among these, from the viewpoint of further reducing the fluorescence quantum yield, a polystyrene resin or a cycloolefin-based resin is preferable, and a polystyrene resin is particularly preferable.

Preferred aspects of the polystyrene resin and the cycloolefin-based resin which are preferable as the resin used in the present invention will be described.

Polystyrene Resin

A polystyrene included in the polystyrene resin refers to a resin including 50% by mass or more of a styrene component. In the present invention, only one polystyrene may be used or two or more polystyrenes may be used in combination. Here, the styrene component refers to a constitutional unit derived from a monomer having a styrene skeleton in the structure.

For the purpose of controlling a photoelastic coefficient of a resin composition or an optical filter to be preferable and controlling hygroscopicity of the resin composition or the optical filter to be preferable, the polystyrene more preferably includes 70% by mass or more of the styrene component and still more preferably includes 85% by mass or more of the styrene component. In addition, it is preferable that the polystyrene is composed of only the styrene component.

Examples of the polystyrene include a homopolymer of a styrene compound and a copolymer of two or more styrene compounds. Here, the styrene compound refers to a compound having a styrene skeleton in the structure and also refers to a compound having, in addition to styrene, a substituent introduced to a portion other than an ethylenically unsaturated bond of styrene. Examples of the styrene compound include styrene; alkyl styrenes such as α-methyl styrene, o-methyl styrene, m-methyl styrene p-methyl styrene, 3,5-dimethyl styrene, 2,4-dimethyl styrene, o-ethyl styrene, p-ethyl styrene, and tert-butyl styrene; and substituted styrenes in which a hydroxyl group, an alkoxy group, a carboxy group, a halogen, or the like is introduced to a benzene nucleus of styrene, such as hydroxy styrene, tert-butoxy styrene, vinyl benzoic acid, o-chlorostyrene, and p-chlorostyrene. Among these, from the viewpoint of easy procurement, material costs, and the like, the polystyrene used in the present invention is preferably a homopolymer of styrene (that is, polystyrene).

In addition, constitutional components other than the styrene component, which are included in the above-described polystyrene, are not particularly limited. That is, the polystyrene may be a styrene-diene copolymer or a styrene-polymerizable unsaturated carboxylate ester copolymer. In addition, it is also possible to use a mixture of polystyrene and synthetic rubber (for example, polybutadiene, polyisoprene, and the like). In addition, high impact polystyrene (HIPS) obtained by graft-polymerizing styrene to synthetic rubber is also preferable. In addition, polystyrene (referred to as graft-type high impact polystyrene "graft HIPS") obtained by dispersing a rubber-form elastic body in a continuous phase of a polymer including the styrene component (for example, a copolymer of the styrene component and a (meth)acrytate ester component) and graft-polymerizing the copolymer to the rubber-form elastic body is also preferable. Furthermore, so-called styrene-based elastomers can also be suitably used.

In addition, the above-described polystyrene may be hydrogenated (may be a hydrogenated polystyrene). The hydrogenated polystyrene is not particularly limited, but is preferably hydrogenated styrene-diene-based copolymers such as a hydrogenated styrene-butadiene-styrene block copolymer (SEBS) and a hydrogenated styrene-isoprene-styrene block copolymer (SEPS), which are resins obtained by adding hydrogen to SBS or SIS. The hydrogenated polystyrene may be used singly or in combination of two or more thereof.

The molecular weight of the polystyrene used in the present invention is appropriately selected depending on the purpose of use, but is in range of, based on mass average molecular weight measured by gel permeation chromatography of a tetrahydrofuran solution (in a case where the polymer is not dissolved, toluene solution), usually 5000 to 500000, preferably 8000 to 200000, and more preferably 10000 to 100000. A polymer having a molecular weight within the above-described range is capable of satisfying both the mechanical strength and molding workability of a molded product at a high level in a well-balanced manner.

As the polystyrene, a plurality of types of polystyrene having different compositions, molecular weights, and the like can be used in combination.

The polystyrene resin can be obtained by a known anion, massive, suspension, emulsification, or solution polymerization method. In addition, in the polystyrene resin, an unsaturated double bond of a conjugated diene or of a benzene ring of a styrene monomer may be hydrogenated. The hydrogenation rate can be measured by a nuclear magnetic resonance device (NMR).

As the polystyrene resin, a commercially available product may be used, and examples thereof include "CLEAREN 530L", "CLEAREN 730L" manufactured by Denka Company Limited, "TUFPRENE 126S", "ASAPRENE T411" manufactured by Asahi Kasei Corporation, "KRATON D1102A", "KRATON D1116A" manufactured by Kraton Corporation, "STYROLUX S", "STYROLUX T" manufactured by INEOS Styrolution Group GmbH, "ASAFLEX 840", "ASAFLEX 860" manufactured by Asahi Kasei Corporation tall of which is SBS), "679", "HF77", "SGP-10" manufactured by PS Japan Corporation, "DICSTYRENE XC-515", "DICSTYRENE XC-535" manufactured by DIC Corporation (all of which is GPPS), "475D", "H0103", "HT478" manufactured by PS Japan Corporation, and "DICSTYRENE GH-8300-5" manufactured by DIC Corporation (all of which is HIPS). Examples of the hydrogenated polystyrene-based resin include "TUFTEC H Series" manufactured by Asahi Kasei Corporation, "KRATON G Series" manufactured by Shell Japan Limited (all of which is SEBS), "DYNARON" manufactured by JSR Corporation (hydrogenated styrene-butadiene random copolymer), and "SEPTON" manufactured by Kuraray Co., Ltd. (SEPS). In addition, examples of a modified polystyrene-based resin include "TUFTEC M Series" manufactured by Asahi Kasei Corporation, "EPOFRIEND" manufactured by Daicel Corporation, "polar group-modified DYNARON" manufactured by JSR Corporation, and "RESEDA" manufactured by Toagosei Co., Ltd.

Cycloolefin-Based Resin

A cyclic olefin compound forming a cycloolefin-based polymer (also referred to as a cyclic polyolefin) included in the cycloolefin-based resin is not particularly limited as long as the cyclic olefin compound is a compound having a ring structure including a carbon-carbon double bond, and examples thereof include a norbornene compound, a monocyclic olefin compound which is not a norbornene compound, a cyclic conjugated diene compound, and a vinyl alicyclic hydrocarbon compound.

Examples of the cycloolefin-based polymer included in the cycloolefin-based resin include (1) polymers including a structural unit derived from a norbornene compound, (2) polymers including a structural unit derived from a monocyclic olefin compound which is not a norbornene compound, (3) polymers including a structural unit derived from a cyclic conjugated diene compound, (4) polymers including a structural unit derived from a vinyl alicyclic hydrocarbon compound, and hydrides of polymers including a structural unit derived from each of the compounds (1) to (4). In the present invention, the polymer including a structural unit derived from a norbornene compound and the polymer including a structural unit derived from a monocyclic olefin compound include ring-opening polymers of the respective compounds.

The cycloolefin-based polymer included in the cycloolefin-based resin is not particularly limited, but is preferably a polymer having a structural unit derived from a norbornene compound, which is represented by Formula (A-II) or (A-III). The polymer having the structural unit represented by Formula (A-II) is an addition polymer of a norbornene compound, and the polymer having the structural unit represented by Formula (A-III) is a ring-opening polymer of a norbornene compound.

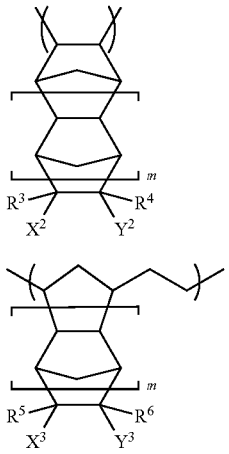

Formula (A-II)

Formula (A-III)

In the formulae, m represents an integer of 0 to 4, and is preferably 0 or 1.

$R^3$ to $R^6$ each independently represent a hydrogen atom or a hydrocarbon group having 1 to 10 carbon atoms.

In the present invention, the hydrocarbon group is not particularly limited as long as the hydrocarbon group is a group consisting of a carbon atom and a hydrogen atom, and examples thereof include an alkyl group, an alkenyl group, an alkynyl group, and an aryl group (aromatic hydrocarbon group). Among these, an alkyl group or an aryl group is preferable.

$X^2$ and $X^3$, $Y^2$ and $Y^3$ each independently represent a hydrogen atom, a hydrocarbon group having 1 to 10 carbon atoms, a halogen atom, a hydrocarbon group having 1 to 10 carbon atoms, which is substituted with a halogen atom, —$(CH_2)nCOOR^{11}$, —$(CH_2)nOCOR^{12}$, —$(CH_2)nNCO$, —$(CH_2)nNO_2$, —$(CH_2)nCN$, —$(CH_2)nCONR^{13}R^{14}$, —$(CH_2)nNR^{13}R^{14}$, —$(CH_2)nOZ$, —$(CH_2)nW$, or (—$CO)_2O$ or (—$CO)_2R^{15}$ which is formed by bonding $X^2$ and $Y^2$, or $X^3$ and $Y^3$.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, and W represents $Si(R^{16})_pD_{(3-p)}$ ($R^{16}$ represents a hydrocarbon group having 1 to 10 carbon atoms, and D represents a halogen atom, —$OCOR^{17}$, or —$OR^{17}$ ($R^{17}$ represents a hydrocarbon group having 1 to 10 carbon atoms), and p represents an integer of 0 to 3). n represents an integer of 0 to 10, and is preferably 0 to 8 and more preferably 0 to 6.

In Formula (A-II) or (A-III), $R^3$ to $R^6$ are respectively preferably a hydrogen atom or —$CH_3$, and from the viewpoint of moisture permeability, still more preferably a hydrogen atom.

Each of $X^2$ and $X^3$ is preferably a hydrogen atom, —$CH_3$, or —$C_2H_5$, and from the viewpoint of moisture permeability, still more preferably a hydrogen atom.

Each of $Y^2$ and $Y^3$ is preferably a hydrogen atom, a halogen atom (particularly a chlorine atom), or —$(CH_2)nCOOR^{11}$ (particularly —$COOCH_3$), and from the viewpoint of moisture permeability, still more preferably a hydrogen atom.

Other groups are appropriately selected.

The polymer having the structural unit represented by Formula (A-II) or (A-III) may further include at least one kind of a structural unit represented by Formula (A-I).

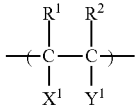

Formula (A-I)

In the formula, $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms, which is substituted with a halogen atom, —$(CH_2)nCOOR^{11}$, —$(CH_2)nOCOR^{12}$, —$(CH_2)nNCO$, —$(CH_2)nNO_2$, —$(CH_2)nCN$, —$(CH_2)nCONR^{13}R^{14}$, —$(CH_2)nNR^{13}R^{14}$, —$(CH_2)nOZ$, —$(CH_2)nW$, or (—$CO)_2O$ or (—$CO)_2NR^{15}$ which is formed by bonding $X^1$ and $Y^1$.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, and W represents $Si(R^{16})_pD_{(3-p)}$ ($R^{16}$ represents a hydrocarbon group having 1 to 10 carbon atoms, and D represents a halogen atom, —$OCOR^{17}$, or —$OR^{17}$ ($R^{17}$ represents a hydrocarbon group having 1 to 10 carbon atoms), and p represents an integer of 0 to 3). n represents an integer of 0 to 10.

From the viewpoint of adhesiveness to a polarizer, the content of the above-described structural unit derived from a norbornene compound in the cyclic polyolefin having the structural unit represented by Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

Addition (co)polymers of a norbornene compound are described in JP1998-007732A (JP-H10-007732A), JP2002-504184A, US2004/0229157A1, WO2004/070463A, or the like.

The polymer of a norbornene compound is obtained by an addition polymerization of norbornene compounds (for example, polycyclic unsaturated compounds of norbornene).

In addition, examples of the polymer of a norbornene compound include copolymers obtained by an addition copolymerization of, as necessary, a norbornene compound, and olefin such as ethylene, propylene, and butene, conjugated diene such as butadiene and isoprene, unconjugated diene such as ethylidene norbornene, or an ethylenically unsaturated compound such as acrylonitrile, acrylic acid, methacrylic acid, maleic acid anhydride, acrylic acid ester, methacrylic acid ester, maleimide, vinyl acetate, and vinyl chloride. Among these, a copolymer with ethylene is preferable.

Examples of the above-described addition (co)polymers of a norbornene compound include APL8008T (Tg: 70° C.), APL6011T (Tg: 105° C.), APL6013T (Tg: 125° C.), and APL6015T (Tg: 145° C.) which are sold by Mitsui Chemicals, Inc. under a trade name of APL and have different glass transition temperatures (Tg). In addition, pellets such as TOPAS8007, TOPAS6013, and TOPAS6015 are commercially available from Polyplastics Co., Ltd. Furthermore, Appear3000 is commercially available from Film Ferrania S. R, L.

As the above-described polymer of a norbornene compound, a commercially available product can be used. For example, polymers are commercially available from JSR Corporation under a trade name of Arton G or Arton F, and polymers are commercially available from Zeon Corporation under a trade name of Zeonor ZF14, ZF16, Zeonex 250, or Zeonex 280.

The hydride of the polymer of a norbornene compound can be synthesized by an addition polymerization or a ring-opening metathesis polymerization of a norbornene compound or the like and then an addition of hydrogen. Synthetic methods are described in, for example, JP1989-240517A (JP-H01-240517A), JP1995-196736A (JP-H07-196736A), JP1985-026024A (JP-S60-026024A), JP1987-019801A (JP-S62-019801A), JP2003-159767A, JP2004-309979A, and the like.

The molecular weight of the cycloolefin-based polymer used in the present invention is appropriately selected depending on the purpose of use, but is in range of, based on mass average molecular weight in terms of polyisoprene or polystyrene measured by gel permeation chromatography of a cyclohexane solution (in a case where the polymer is not dissolved, toluene solution), usually 5000 to 500000, preferably 8000 to 200000, and more preferably 10000 to 100000. A polymer having a molecular weight within the above-described range is capable of satisfying both the mechanical strength and molding workability of a molded product at a high level in a well-balanced manner.

From the viewpoint of sharpness of absorption waveform and light resistance, the resin composition according to the embodiment of the present invention includes the binder resin in an amount of preferably 50% by mass or more, more preferably 70% by mass or more, and particularly preferably 90% by mass or more.

Two or more binder resins may be used, and binders having different compositional ratios and/or molecular weights may be used in combination. In this case, the total content of the respective binder resins is within the above-described range.

Additive

The resin composition according to the embodiment of the present invention may include an additive as long as the effects of the present invention are not impaired. For example, the resin composition according to the embodiment of the present invention may include an additive which can be generally blended in a plastic film as necessary. Examples of the additive include an antioxidant, a heat stabilizer, a light stabilizer, an ultraviolet absorber, an antistatic agent, a lubricant, a plasticizer, and a filler, and the content thereof can be selected within a range which does not impair the object of the present invention. In addition, examples of the additive include a known plasticizer, an organic acid, a polymer, a retardation adjuster, an ultraviolet absorber, an antioxidant, and a matting agent. With regard to these compounds, reference can be made to the description in paragraphs "0062" to "0097" of JP2012-155287A, and the contents of which are incorporated herein by reference. In addition, examples of the additive include a peeling accelerator, an organic acid, and a polyvalent carboxylic acid derivative. With regard to these compounds, reference can be made to the description in paragraphs "0212" to "0219" of WO2015/005398A, and the contents of which are incorporated herein by reference. Furthermore, examples of the additive include a radical scavenger and a deterioration inhibitor which will be described later.

The content of the additive (in a case where the resin composition contains two or more kinds of additives, total content thereof) is preferably 50 parts by mass or less, more preferably 30 parts by mass or less, and still more preferably 5 to 30 parts by mass with respect to 100 parts by mass of the binder resin.

Antioxidant

A preferred example of the additive includes an antioxidant. With regard to the antioxidant, reference can be made to the description in paragraphs "0143" to "0165" of WO2015/005398A, and the contents of which are incorporated herein by reference.

Radical Scavenger

A preferred example of the additive includes a radical scavenger. With regard to the radical scavenger, reference can be made to the description in paragraphs "0166" to "0199" of WO2015/005398A, and the contents of which are incorporated herein by reference.

Deterioration Inhibitor

A preferred example of the additive includes a deterioration inhibitor. With regard to the deterioration inhibitor, reference can be made to the description in paragraphs "0205" and "0206" of WO2015/005398A, and the contents of which are incorporated herein by reference.

Ultraviolet Absorber

In the present invention, from the viewpoint of preventing deterioration, an ultraviolet absorber may be added to the optical filter. From the viewpoint of excellent absorption capacity of ultraviolet rays with a wavelength of 370 nm or less and good liquid crystal display properties, an ultraviolet absorber having a small absorption of visible light with a wavelength of 400 nm or more is preferably used. Specific examples of the ultraviolet absorber preferably used in the present invention include a hindered phenol-based compound, a hydroxybenzophenone-based compound, a benzotriazole-based compound, a salicylic acid ester-based compound, a benzophenone-based compound, a cyanoacrylate-based compound, and a nickel complex salt compound.

Examples of the hindered phenol-based compound include 2,6-di-tert-butyl-p-cresol, pentaerythrityl-tetrakis[3-(3,5-di-tert-butyl-4-hydroxyphenyl)propionate], N,N'-hexamethylenebis(3,5-di-tert-butyl-4-hydroxy-hydrocinnamide), 1,3,5-trimethyl-2,4,6-tris(3,5-di-tert-butyl-4-hydroxybenzyl)benzene, and tris-(3,5-di-tert-butyl-4-hydroxybenzyl)-isocyanurate.

Examples of the benzotriazole-based compound include 2-(2'-hydroxy-5'-methyphenyl)benzotriazole,
2,2-methylenebis(4-(1,1,3,3-tetramethylbutyl)-6-(2H-benzotriazol-2-yl)phenol),
(2,4-bis-(n-octylthio)-6-(4-hydroxy-3,5-di-tert-butylanilino)-1,3,5-triazine, triethylene glycol-bis[3-(3-tert-butyl-5-methyl-4-hydroxyphenyl)propionate],
N,N-hexamethylenebis(3,5-di-tert-butyl-4-hydroxy-hydrocinnamide),
1,3,5-trimethyl-2,4,6-tris(3,5-di-tert-butyl-4-hydroxybenzyl)benzene,
2(2'-hydroxy-3',5'-di-tert-butylphenyl)-5-chlorobenzotriazole,
(2(2'-hydroxy-3',5'-di-tert-amylphenyl)-5-chlorobenzotriazole, 2,6-di-tert-butyl-p-cresol, pentaerythrityl-tetrakis[3-(3,5-di-tert-butyl-4-hydroxyphenyl)propionate], and
2-(2H-benzotriazol-2-yl-6-(1-methyl-1-phenylethyl-4-(1,1,3,3-tetramethylbutyl)phenol.

Optical Filter

A film formed using the resin composition according to the embodiment of the present invention is suitable as an optical filter. That is, the optical filter according to the embodiment of the present invention is a film including the resin composition according to the embodiment of the present invention. The content of each component in the optical filter and the film is the same as that in the resin composition according to the embodiment of the present invention.

Hereinafter, a method of producing an optical filter will be described.

Method of Producing Optical Filter

The method of producing an optical filter is not particularly limited as long as the resin composition according to the embodiment of the present invention is used, and the optical filter can be appropriately produced by am ordinary molding method.

The optical filter according to the embodiment of the present invention can be produced by, for example, a method of forming a solution casting film. In the method of forming a solution casting film, a film can be produced using a solution (dope, one aspect of the resin composition according to the embodiment of the present invention) prepared by dissolving at least the compound represented by Formula (1) and the binder resin in an organic solvent.

The organic solvent is not particularly limited as long as the organic solvent can dissolve the compound represented by Formula (1) and the binder resin. For example, a solvent selected from an alcohol having 1 to 4 carbon atoms, an ether having 3 to 12 carbon atoms, a ketone having 3 to 12 carbon atoms, an ester having 3 to 12 carbon atoms, and a halogenated hydrocarbon having 1 to 6 carbon atoms can be used.

The above-described ether, ketone, and ester may have a cyclic structure. In addition, a compound having any two or more functional groups (that is, —O—, —CO—, and —COO—) of the above-described ether, ketone, and ester can also be used as the organic solvent. The above-described organic solvent may have another functional group such as an alcoholic hydroxyl group. In a case of an organic solvent having two or more kinds of functional groups, it is preferable that the number of carbon atoms of the organic solvent is within the above-described preferred range with regard to the number of carbon atoms of the solvent having any functional group.

The content of the binder resin in the solution is preferably adjusted to 10% to 40% by mass and still more preferably 10% to 30% by mass. The above-described optional additive may be added to the organic solvent (main solvent).

With regard to a drying method in the method of firming a solution casting film, reference can be made to the description in U.S. Pat. Nos. 2,336,310A, 2,367,603A, 2,492,078A, 2,492,977A, 2,492,978A, 2,607,704A, 2,739,069A, 2,739,070A, GB640731B, GB736892B, JP1970-004554B (JP-S45-004554B), JP1974-005614B (JP-S49-005614B), JP1985-176834A (JP-S60-176834A), JP1985-203430A (JP-S60-203430A), and JP1987-115035A (JP-S62-115035A). Drying on a band can be performed by blowing air or an inert gas such as nitrogen.

It is also possible to cast two or more layers using the prepared solution (dope) to form a film. It is preferable that the dope is cast onto the band and the solvent is evaporated to form a film. It is preferable that the concentration of the dope before casting is adjusted such that the solid content is in a range of 10% to 40% by mass. It is preferable that the surface of the band is polished off in a state of mirror surface.

In a case of casting two or more layers of a plurality of cycloolefin-based resin solutions, a film may be produced while casting each of the solutions including the cycloolefin-based resin from a plurality of casting ports provided at intervals in a traveling direction of a support, and laminating the solutions. With regard to the methods, for example, methods described in JP1986-158414A (JP-S61-158414A), JP1989-122419A (JP-H01-122419A), and JP1999-198285A (JP-H11-198285A) can be used. In addition, it is also possible to cast a cycloolefin-based resin solution from two casting ports to form a film. With regard to the method, for example, methods described in JP1985-027562A (JP-S60-027562A), JP1986-094724A (JP-S61-094724A), JP1986-947245A (JP-S61-947245A), JP1986-104813A (JP-S61-104813A), JP1986-158413A (JP-S61-158413A), and JP1994-134933A (JP-H06-134933A) can be used. Furthermore, a casting method of a resin film described in JP1981-162617A (JP-S56-162617A), in which the flow of a high-viscosity resin solution is wrapped with a low-viscosity resin solution and the high-viscosity and low-viscosity resin solutions are extruded at the same time.

In addition, a film can be produced by, using two casting ports, peeling off a film formed on a support by a first casting port and performing second casting on a side which is in contact with the support surface. Examples thereof include a method described in JP1969-020235B (JP-S44-020235B).

As the solution to be cast, the same solution may be used or two or more different solutions may be used. It is sufficient that, in order to allow a plurality of layers to have a function, a solution corresponding to the function is extruded from each casting port. Furthermore, as the forming of a solution casting film, an aspect in which other functional layers (for example, an adhesive layer, a dye layer, an antistatic layer, an antihalation layer, an ultraviolet absorbing layer, a polarizing layer, and the like) are cast at the same time can be used.

The compound (colorant) represented by Formula (1) can be added to the above-described solution by, for example, mixing with the binder resin in the organic solvent in a case of preparing the dope.

Drying Treatment

Steps from casting of the dope to post-drying may be performed under an atmosphere of air or under an atmosphere of inert gas such as nitrogen. A winding machine used for producing the optical filter according to the embodiment of the present invention may be a commonly used winding machine, and the winding can be performed by a constant tension method, a constant torque method, a taper tension method, a program tension control method with a constant internal stress, and the like.

Stretching Treatment

The above-described optical filter can be also be subjected to a stretching treatment. It is possible to impart a desired retardation to the optical filter by the stretching treatment. As a stretching direction of the optical filter, any of a width direction or a longitudinal direction is preferable.

The stretching method in the width direction is described in, for example, JP1987-115035A (JP-S62-115035A), JP1992-152125A (JP-H04-152125A), JP1992-284211A (JP-H04-284211A), JP1992-298310A (JP-H04-298310A), JP1999-048271A (JP-H11-048271A), and the like.

The stretching of the film (optical filter before the stretching treatment) is performed under heating conditions. The film can be stretched during the treatment of drying, which is particularly effective in a case where the solvent remains. In a case of stretching in the longitudinal direction, for example, the film is stretched by adjusting a speed of a film transport roller so that a film winding speed is faster than a film peeling speed. In a case of stretching in the width direction, the film can be stretched by transporting the film while holding a width of the film by a tenter and gradually widening a width of the tenter. It is also possible to stretch the film using a stretching machine (preferably monoaxial stretching using a long stretching machine) after drying the film.

The method for forming the optical filter is not particularly limited, and the optical filter can be formed as described above. Furthermore, any of a heat melting molding method or a solution casting method can be used. The heat melting molding method can be classified in more detail into an extrusion molding method, a press molding method, an inflation molding method, an injection molding method, a blow molding method, a stretch molding method, and the like. Among these methods, in order to obtain a film having excellent mechanical strength, surface accuracy, and the like, an extrusion molding method, an inflation molding method, or a press molding method is preferable and an extrusion molding method is most preferable. The molding conditions are appropriately selected depending on the purpose of use and the molding method, and in a case of the heat melting molding method, the cylinder temperature is appropriately set in a range of usually 150° C. to 400° C., preferably 200° C. to 350° C., and more preferably 230° C. to 330° C. In a case where the polymer temperature is too low, the fluidity deteriorates, which may cause sink marks and distortion in the film, and in a case where the polymer temperature is too high, voids or silver streaks may be generated due to thermal decomposition of the polymer, or molding defects such as yellowing of the film may occur.

Physical Properties or Characteristics of Optical Filter

Preferred physical properties or characteristics of the optical filter according to the embodiment of the present invention will be described.

In consideration of handling in a case of laminating and improvement of productivity by shortening the drying time, the thickness of the optical filter is in a range of usually 5 to 300 μm, preferably 10 to 200 μm, and more preferably 20 to 100 μm.

The wetting tension of a surface of the optical filter is preferably 40 mN/m or more, more preferably 50 mN/m or more, and still more preferably 55 mN/m or more. In a case where the wetting tension of the surface is within the above-described range, the adhesive strength between the optical filter and the polarizer is improved. In order to adjust the wetting tension of the surface, a known surface treatment such as a corona discharge treatment, an ozone spraying, an ultraviolet irradiation, a flame treatment, and a chemical treatment can be performed.

The phase difference (retardation) of the optical filter according to the embodiment of the present invention will be described. The in-plane phase difference value Ro at 589 nm of the optical filter according to the embodiment of the present invention is preferably 0 to 20 nm and more preferably 0 to 10 nm. In addition, the phase difference value Rth in the thickness direction is preferably −20 to 50 nm and more preferably −10 to 20 nm.

Generally, the retardation can be controlled by a retardation of the film before stretching, a stretching ratio, a stretching temperature, and a thickness of a stretched alignment film. In a case where the film before stretching has a constant thickness, since the absolute value of retardation tends to increase as the stretching ratio increases, a stretched alignment film having a desired retardation can be obtained by changing the stretching ratio.

In a case where the optical filter is subjected to the stretching treatment, the thickness of the optical filter before stretching is preferably approximately 50 to 500 μm, and it is preferable that the uneven thickness is small, which is within ±8%, preferably within ±6%, and more preferably within ±4%.

The stretching ratio is preferably 1.1 to 10 times and more preferably 1.3 to 8 times, and it is sufficient to set a stretching ratio within the range to be a desired retardation.

In the obtained optical filter as described above, the molecules are aligned by stretching, so that the optical filter can have a desired retardation value.

It is preferable that the variation of retardation is small, in which, in the optical filter according to the embodiment of the present invention, the variation of retardation at a wavelength of 589 nm in any retardation of the in-plane direction or the thickness direction is usually within ±50 nm, preferably ±30 nm or less, and more preferably ±20 nm or less.

The variations of retardation in the in-plane direction and the thickness direction or the uneven thickness of the optical filter can be reduced by using a film before stretching which has a smaller variation or uneven thickness, or by applying stress evenly to the film during stretching. For the purpose, it is desirable to stretch the film under an environment in which the temperature is controlled in a uniform temperature distribution, preferably within ±5° C., still more preferably within ±2° C., and particularly preferably within ±0.5° C.

Image Display Device

Examples of the image display device according to the embodiment of the present invention include a liquid crystal display device and an organic electroluminescence display device. The image display device according to the embodiment of the present invention will be described using a liquid crystal display device (also referred to as a "liquid crystal display device of the present invention") as a preferred aspect.

The liquid crystal display device of the present invention has a feature of including at least one optical filter according to the embodiment of the present invention. The optical filter according to the embodiment of the present invention may be used as a polarizing plate protective film and/or a pressure-sensitive adhesive layer as described later, or may be included in a backlight unit used in a liquid crystal display device.

It is preferable that the liquid crystal display device includes an optical filter, polarizing plates including a polarizer and a polarizing plate protective film, a pressure-sensitive adhesive layer, and a liquid crystal cell, and it is preferable that the polarizing plates are attached to the liquid crystal cell through the pressure-sensitive adhesive layer. In the liquid crystal display device, the optical filter may also serve as the polarizing plate protective film or the pressure-sensitive adhesive layer. That is, it is divided into a case where the liquid crystal display device includes polarizing plates including a polarizer and an optical filter (polarizing plate protective film), a pressure-sensitive adhesive layer, and a liquid crystal cell, and a case where the liquid crystal display device includes polarizing plates including a polarizer and a polarizing plate protective film, an optical filter (pressure-sensitive adhesive layer), and a liquid crystal cell.

FIG. 1 is a schematic view showing an embodiment of the liquid crystal display device of the present invention. In FIG. 1, a liquid crystal display device 10 consists of a liquid crystal cell having a liquid crystal layer 5 and a liquid crystal cell upper electrode substrate 3 and a liquid crystal cell lower electrode substrate 6 disposed above and below the liquid crystal layer 5, and an upper polarizing plate 1 and a lower polarizing plate 8 disposed on both sides of the liquid crystal cell. A color filter layer may be laminated on the upper electrode substrate 3 or the lower electrode substrate 6. On a rear surface of the liquid crystal display device 10, a backlight is disposed. The light source of the backlight is not particularly limited. For example, a light emitting device formed of a white LED can be used.

It is preferable that each of the upper polarizing plate 1 and the lower polarizing plate 8 has a configuration in which two polarizing plate protective films and a polarizer are laminated so as to sandwich the polarizer with the polarizing plate protective films, and in the liquid crystal display device 10 of the present invention, at least one polarizing plate is a polarizing plate including the optical filter according to the embodiment of the present invention.

In addition, in the liquid crystal display device 10 of the present invention, the liquid crystal cell and the polarizing plate (upper polarizing plate 1 and/or lower polarizing plate 8) may be bonded together through a pressure-sensitive adhesive layer (not shown). In this case, the optical filter according to the embodiment of the present invention may also serve as the above-mentioned pressure-sensitive adhesive layer.

The liquid crystal display device 10 includes an image direct vision-type liquid crystal display, an image projection-type liquid crystal display device, and a light modulation-type liquid crystal display device. An active matrix liquid crystal display device in which a three-terminal or two-terminal semiconductor element such as TFT or MIM is used is effective for the present invention. In addition, a passive matrix liquid crystal display device represented by an STN mode which is called as time division driving is also effective.

In a case where the optical filter according to the embodiment of the present invention is included in the backlight unit, the polarizing plate of the liquid crystal display device may be a normal polarizing plate (polarizing plate not including the optical filter according to the embodiment of the present invention), or may be a polarizing plate including the optical filter according to the embodiment of the present invention. In addition, the pressure-sensitive adhesive layer may be a normal pressure-sensitive adhesive layer (not the optical filter according to the embodiment of the present invention), or may be a pressure-sensitive adhesive layer formed of the optical filter according to the embodiment of the present invention.

An IPS mode liquid crystal display device described in paragraphs 0128 to 0136 of JP2010-102296A is preferable as the liquid crystal display device of the present invention.

Polarizing Plate

The polarizing plate used in the present invention includes a polarizer and at least one polarizing plate protective film.

The polarizing plate used in the present invention is preferably a polarizing plate having a polarizer and polarizing plate protective films on both surfaces of the polarizer, and it is preferable that at least one surface of the polarizer includes the optical filter according to the embodiment of the present invention as the polarizing plate protective film. The opposite surface of the polarizer to the surface having the optical filter according to the embodiment of the present invention (polarizing plate protective film) may have a normal polarizing plate protective film.

The film thickness of the polarizing plate protective film used in the present invention is 5 μm to 120 μm and more preferably 10 μm to 100 μm. A thinner film is preferable in that, in a case of being incorporated in the liquid crystal display device, display unevenness over time in high temperature and high humidity is less likely to occur. On the other hand, in a case where the film is too thin, it is difficult to transport the film stably in a case of producing the film and producing the polarizing plate. In a case where the optical filter according to the embodiment of the present invention also serves as the polarizing plate protective film, it is preferable that the thickness of the optical filter satisfies the above-described range.

Shape and Configuration

The shape of the polarizing plate used in the present invention includes not only a polarizing plate of an aspect of a film piece cut into a size so as to be incorporated in the liquid crystal display device as it is, but also a polarizing plate of an aspect in which the polarizing plate is produced in a longitudinal shape by a continuous production and wound up in a rolled shape (for example, an aspect having a roll length of 2500 m or more or 3900 m or more). In order to use the polarizing plate as a large-sized screen liquid crystal display device, the width of the polarizing plate is preferably 1470 mm or more.

The polarizing plate used in the present invention is configured of a polarizer and at least one polarizing plate protective film, but it is also preferable that the polarizing plate is further configured by attaching a separate film on uric surface of the polarizing plate.

The separate film is used for the purpose of protecting the polarizing plate during the shipping of the polarizing plate and the inspection of product. The separate film is used for the purpose of covering an adhesive layer which is attached to a liquid crystal plate, and used on a surface where the polarizing plate is attached to the liquid crystal plate.

Polarizer

The polarizer used for the polarizing plate used in the present invention will be described.

The polarizer which can be used for the polarizing plate used in the present invention is preferably configured of polyvinyl alcohol (PVA) and a dichroic molecule, but as described in JP1999-248937A (JP-H11-248937A), a polyvinylene-based polarizer in which a polyene structure is generated by dehydrating PVA or dechlorinating polyvinyl chloride and aligning the polyene structure can also be used.

Film Thickness of Polarizer

The film thickness of the polarizer before stretching is not particularly limited, but from the viewpoint of stability of retaining film and homogeneity of stretching, is preferably 1 μm to 1 mm and particularly preferably 5 to 200 μm. In addition, as described in JP2002-236212A, a thin PVA film in which the stress generated in a case of being stretched 4 to 6 times in water is 10 N or less may be used.

Method of Producing Polarizer

The method of producing a polarizer is not particularly limited, and for example, it is preferable that the polarizer is configured by form PVA into a film and introducing the dichroic molecule to the film. The PVA film can be produced by the method described in paragraphs "0213" to "0237" of JP2007-086748A and by the description of—JP3342516B, JP1997-328593A (JP-H09-328593A), JP2001-302817A, JP2002-144401A, and the like.

Method of Laminating Polarizer and Polarizing Plate Protective Film

The polarizing plate used in the present invention is produced by adhering (laminating) at least one polarizing plate protective film (preferably the optical filter according to the embodiment of the present invention) on at least one surface of the above-described polarizer.

The polarizing plate used in the present invention is preferably produced by a method in which a polarizing plate protective film is subjected to an alkali treatment, and is attached, using a completely saponified polyvinyl alcohol aqueous solution, to both surfaces of a polarizer produced by dipping and stretching a polyvinyl alcohol film in an iodine solution.

Examples of an adhesive used to attach the treated surface of the polarizing plate protective film to the polarizer include polyvinyl alcohol-based adhesives such as polyvinyl alcohol and polyvinyl butyral and vinyl-based latex such as butyl acrylate.

In the polarizing plate used in the present invention, a method of attaching the polarizing plate protective film to the polarizer is preferably a method in which the polarizing plate protective film is attached to the polarizer so that a transmission axis of the polarizer and a slow axis of the polarizing plate protective film are substantially parallel, orthogonal, or 45°.

The slow axis can be measured by various known methods, for example, using a birefringence meter (KOBRADH, manufactured by Oji Scientific Instruments).

Here, "substantially parallel" refers to that the direction of the main refractive index nx of the polarizing plate protective film and the direction of the transmission axis of the polarizing plate intersect at an angle within +5°, preferably at an angle within ±1°, and more preferably angle within ±0.5°. In a case where the intersecting angle is within ±1°, polarization performance under polarizing plate crossed nicols is less likely to be deteriorated and light leakage does not easily occur, which is preferable.

The description in which the direction of the main refractive index nx and the direction of the transmission axis are orthogonal or 45° means that the angle at which the direction of the main refractive index nx and the direction of the transmission axis intersect is within a range of ±5° with respect to an exact angle of being orthogonal and 45°, and the difference with respect to the exact angle is preferably within a range of ±1° and more preferably within a range of ±0.5°.

Functionalization of Polarizing Plate

The polarizing plate used in the present invention is preferably used as a functionalized polarizing plate complexed with an antireflection film for improving visibility of a display, a luminance improving film, or an optical film having a functional layer such as a hard coat layer, a forward scattering layer, an antiglare layer, an antifouling layer, and an antistatic layer. The antireflection film for functionalization, the luminance improving film, other functional optical films, the hard coat layer, the forward scattering layer, and the antiglare layer are described in paragraphs "0257" to "0276" of JP2007-086748A, and a functionalized polarizing plate can be produced based on the description.

Pressure-Sensitive Adhesive Layer

In the liquid crystal display device of the present invention, the polarizing plate is preferably attached to the liquid crystal cell through a pressure-sensitive adhesive layer. The optical filter according to the embodiment of the present invention may also serve as the pressure-sensitive adhesive layer. In a case where the optical filter according to the embodiment of the present invention does not serve as the pressure-sensitive adhesive layer, a normal pressure-sensitive adhesive layer can be used as the pressure-sensitive adhesive layer.

The pressure-sensitive adhesive layer is not particularly limited as long as the pressure-sensitive adhesive layer can attach the polarizing plate to the liquid crystal cell, and for example, an acrylic type, a urethane type, polyisobutylene, or the like is preferable.

In a case where the optical filter according to the embodiment of the present invention also serves as a pressure-sensitive adhesive layer, the pressure-sensitive adhesive layer includes the colorant and the binder, and further contains a cross-linking agent, a coupling agent, or the like to impart adhesiveness.

In a case where the optical filter also serves as a pressure-sensitive adhesive layer, the pressure-sensitive adhesive layer includes the binder in an amount of preferably 90% to 100% by mass and more preferably 95% to 100% by mass. The content of the colorant is as described above.

The thickness of the pressure-sensitive adhesive layer is not particularly limited, but is preferably 1 to 50 μm and more preferably 3 to 30 μm.

Liquid Crystal Cell

The liquid crystal cell is not particularly limited, and a normal liquid crystal cell can be used.

Solid-State Imaging Element

The solid-state imaging element according to the embodiment of the present invention includes the optical filter according to the embodiment of the present invention. The configuration of the solid-state imaging element according to the embodiment of the present invention is not particularly limited as long as the solid-state imaging element includes the optical filter according to the embodiment of the present invention and functions as a solid-state imaging element. Since the solid-state imaging element according to the embodiment of the present invention includes the optical filter (color filter) according to the embodiment of the present invention having excellent weather fastness and contrast, the solid-state imaging element according to the embodiment of the present invention is excellent in image tone and color reproducibility over a long period of use.

The configuration of the solid-state imaging element is not particularly limited as long as the solid-state imaging element includes the color filter of the present invention and functions as a solid-state imaging element. Examples thereof include a configuration in which, on a support, a solid-state imaging element (CCD image sensor, CMOS image sensor, or the like) has light-receiving elements which consist of a plurality of photodiodes and polysilicon or the like and constitute a light-receiving area of the solid-state imaging element, and the color filter of the present invention is provided on forming surface of the light-receiving elements in the support (for example, a portion other than a light receiving section, a pixel section for color adjustment, or the like) or on the opposite side of the forming surface.

EXAMPLES

Hereinafter, the present invention will be described in detail using examples. The materials, reagents, amounts and proportions of substances, operations, and the like described in the following examples can be appropriately modified as long as the gist of the present invention is maintained. Therefore, the scope of the present invention is not limited to the specific examples described below.

Synthesis Example 1

Synthesis of Compound A-1

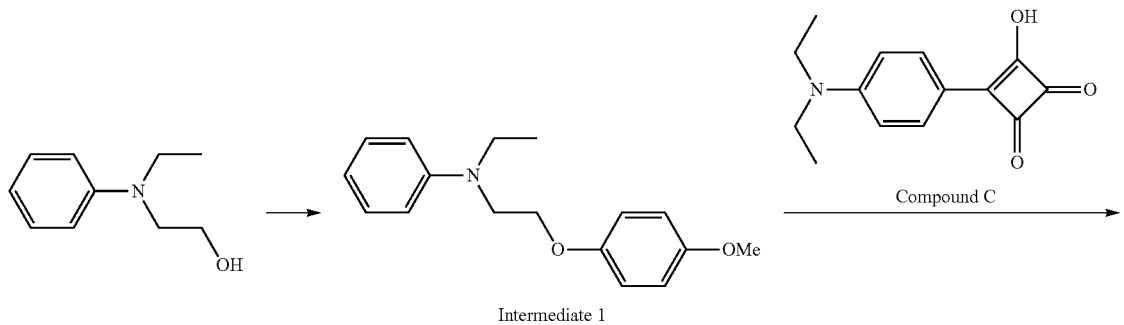

Intermediate 1

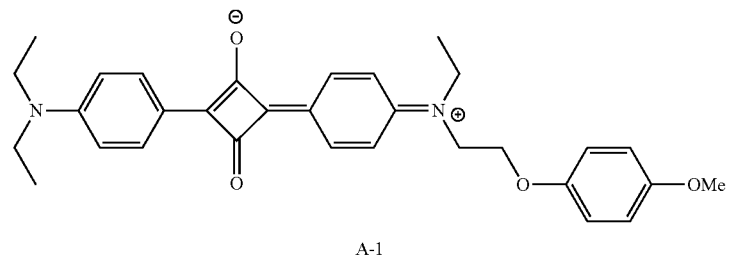

A-1

28.8 parts by mass of thionyl chloride was added to a solution in which 20 parts by mass of N-ethyl-N-2-ethanolaniline was dissolved in 300 parts by mass of chloroform, and the solution was heated under reflux for 2 hours. Thereafter, 300 ml of a saturated aqueous solution of potassium carbonate was added to the reaction solution, and a chloroform layer was extracted and concentrated. Thereafter, the product was purified by silica gel column chromatography to obtain 14.5 parts by mass of an intermediate 1a.

Next, 1 part by mass of the obtained intermediate 1a, 0.83 parts by mass of potassium carbonate, 0.09 parts by mass of potassium iodide, and 0.7 parts by mass of 4-methoxyphenol were weighed out, and heated and stirred in 20 parts by mass of dimethylformamide at 85° C. for 24 hours and then at 105° C. for 6 hours. After completion of the reaction, the reaction solution was subjected to a liquid separation purification by adding water and ethyl acetate, an organic layer was concentrated, and the product was purified by silica gel column chromatography to obtain 0.4 parts by mass of an intermediate 1.

0.3 parts by mass of the obtained intermediate 1 and 0.3 parts by mass of a compound C obtained by synthesizing with reference to WO2008/090757A and the like were weighed out and heated under reflux in a mixed solvent of 20 parts by mass of toluene and 20 parts by mass of butanol for 3 hours. After completion of the reaction, the reaction solution was cooled to 0° C., and the precipitated solid was filtered to obtain a crude product. The etude product was purified by silica gel column chromatography, thereby obtaining 0.16 parts by mass of a target compound A-1.

$^1$H-NMR (CDCl$_3$): δ 1.26 to 1.31 (m, 9H), 1.64 (s, 3H), 3.50 to 3.56 (m, 4H), 3.62 to 3.68 (m, 2H), 3.86 (t, 2H), 4.15 (t, 2H), 6.75 (d, 2H), 6.81 (d, 2H), 8.37 to 8.40 (m, 4H)

Compounds A-2 to A-19 were synthesized according to Synthesis Example 1.

Synthesis Example 2

Synthesis of Compound B-3

A compound B-3 was synthesized according to the following scheme.

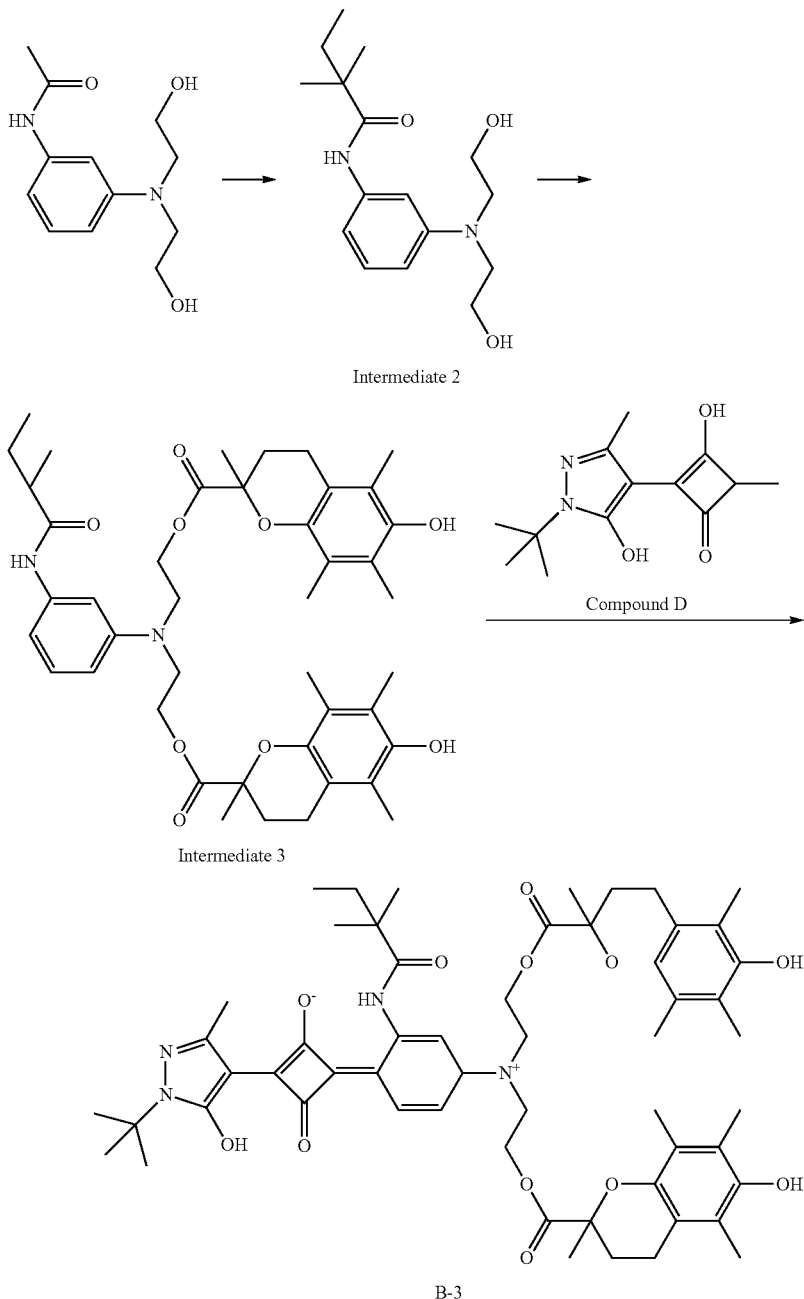

76.5 parts by mass of isopropanol and 132.5 parts by mass of 35% HCl were added to 25 parts by mass of 3'-[bis(2-hydroxyethyl)amino] acetanilide, and the solution was heated under reflux for 12 hours. Thereafter, the reaction solution was concentrated, 97.5 parts by mass of N,N-dimethylacetainide, 9.0 parts by mass of triethylamine and 12.0 parts by mass of 2,2-dimethylbutyryl chloride were added to the obtained liquid at 0° C., the temperature of the solution was returned to room temperature, and the solution was stirred for 1 hour. The obtained reaction solution was concentrated, and then purified by silica gel column chromatography to obtain 25 parts by mass of an intermediate 2. Next, 12.8 parts by mass of tetrahydrofuran, 8.7 parts by mass of trolox, 6.6 parts by mass of 1-(3-dimethylaminopropyl)-3-ethylcarbodiimide hydrochloride, and 0.42 parts by mass of N,N-dimethyl-4-aminopyridine were added to 3.4 parts by mass of the obtained intermediate 2, and the solution was stirred at room temperature for 8 hours. After completion of the reaction, the reaction solution was subjected to a liquid separation purification by adding saturated aqueous sodium hydrogen carbonate and ethyl acetate, an organic layer was concentrated, and the product was purified by silica gel column chromatography to obtain 7.8 parts by mass of an intermediate 3. 17.3 parts by mass of toluene, 16.2 parts by mass of n-butanol, and 0.70 parts by mass of a compound D were added to 2.1 parts by mass of the obtained intermediate 3, and the solution was heated under reflux for 2 hours. Thereafter, the reaction solution was concentrated, and then purified by silica gel column chromatography, thereby obtaining 0.25 parts by mass of B-3.

$^1$H-NMR (CDCl$_3$): δ 11.06 (1H, s), 10.57 (1H, s), 8.01 (2H, s), 6.16 (1H, d, J=8.9 Hz), 6.07 (1H, d, J=8.9 Hz), 5.16 (1H, s), 4.12 (4H, t, J=7.2 Hz), 3.87 (4H, t, J=7.2 Hz), 3.15 to 2.74 (4H, m), 2.50 (3H, s), 2.44 to 2.26 (4H, m), 2.19 (3H, s), 2.16 (3H, s), 2.10 (3H, s), 2.05 (3H, s), 2.00 (3H, s), 1.95 (3H, s), 1.59 (6H, s), 1.57 (9H, s), 1.36 (9H, s), 1.26 (2H, q, J=7.6 Hz), 0.90 (3H, t, J=7.6 Hz)

Compounds B-1, B-2, and B-4 to B-23 were synthesized according to Synthesis Example 2.

The energy levels of HOMO and LUMO of each structural part of Dye and $Q^1$ in the compounds A-1 to A-19 and B-1 to B-23 synthesized above are shown in the following tables. The unit of energy level is eV. In addition, in the following tables, for example, "<−2.29" means that it is smaller than −229 eV (the numerical value as an absolute value is larger than 2.29).

TABLE 1

| | Dye | | Q1 | |
|---|---|---|---|---|
| | HOMO | LUMO | HOMO | LUMO |
| A-1 | 0.72 | −1.22 | 0.71 | <−2.29 |
| A-2 | 0.75 | −1.13 | 0.52 | <−2.48 |
| A-3 | 0.78 | −1.16 | >3.0 | 0.1 |
| A-4 | 0.7 | −1.24 | >2.5 | −0.5 |
| A-5 | 0.72 | −1.22 | >2.39 | −0.61 |
| A-6 | 0.72 | −1.22 | >2.19 | −0.71 |
| A-7 | 0.72 | −1.22 | 0.12 | <−2.88 |
| A-8 | 0.72 | −1.22 | 0.68 | <−2.32 |
| A-9 | 0.72 | −1.22 | >2.27 | −0.63 |
| A-10 | 0.72 | −1.22 | 0.37 | <−2.63 |
| A-11 | 0.72 | −1.22 | 0.71 | <−2.29 |
| A-12 | 0.72 | −1.22 | 0.71 | <−2.29 |
| A-13 | 0.72 | −1.22 | 0.71 | <−2.29 |
| A-14 | 0.65 | −1.47 | 0.12 | <−2.88 |
| A-15 | 0.68 | −1.30 | 0.55 | <−2.48 |
| A-16 | 0.66 | −1.46 | 0.62 | <−2.38 |
| A-17 | 0.69 | −1.23 | 0.68 | <−2.32 |

TABLE 1-continued

| | Dye | | Q1 | |
|---|---|---|---|---|
| | HOMO | LUMO | HOMO | LUMO |
| A-18 | 0.71 | −1.24 | >2.19 | −0.71 |
| A-19 | 0.65 | −1.43 | 0.52 | <−2.48 |

TABLE 2

| | Dye | | Q1 | |
|---|---|---|---|---|
| | HOMO | LUMO | HOMO | LUMO |
| B-1 | 0.66 | −1.44 | 0.52 | <−2.48 |
| B-2 | 0.66 | −1.44 | 0.52 | <−2.48 |
| B-3 | 0.68 | −1.41 | 0.52 | <−2.48 |
| B-4 | 0.72 | −1.40 | 0.71 | <−2.29 |
| B-5 | 0.65 | −1.47 | >3.0 | 0.1 |
| B-6 | 0.67 | −1.45 | >2.45 | −0.55 |
| B-7 | 0.65 | −1.43 | >3.0 | 0.1 |
| B-8 | 0.71 | −1.45 | >2.5 | −0.5 |
| B-9 | 0.65 | −1.51 | >2.19 | −0.71 |
| B-10 | 0.71 | −1.45 | >2.39 | −0.61 |
| B-11 | 0.71 | −1.45 | >2.27 | −0.63 |
| B-12 | 0.67 | −1.46 | 0.12 | <−2.88 |
| B-13 | 0.72 | −1.36 | 0.25 | <−2.75 |
| B-14 | 0.69 | −1.41 | 0.31 | <−2.69 |
| B-15 | 0.71 | −1.38 | 0.37 | <−2.63 |
| B-16 | 0.7 | −1.40 | 0.61 | <−2.39 |
| B-17 | 0.69 | −1.61 | 0.68 | <−2.32 |
| B-18 | 0.72 | −1.40 | 0.71 | <−2.29 |
| B-19 | 0.64 | −1.75 | 0.62 | <−2.38 |
| B-20 | 0.71 | −1.45 | 0.68 | <−2.32 |
| B-21 | 0.65 | −1.51 | >2.19 | −0.71 |
| B-22 | 0.65 | −1.51 | 0.52 | <−2.48 |
| B-23 | 0.64 | −1.52 | 0.12 | <−2.88 |

Example 1

Material

Resin 1

A commercially available polystyrene (manufactured by PS Japan Corporation SGP-10 Tg: 100° C.) was heated at 110° C., returned to normal temperature (23° C.), and then used.

Base Material Film 1

A commercially available polyethylene terephthalate film, LUMIRROR (R) S105 (film thickness: 38 μm, manufactured by Toray Industries, Inc.) was used as a base material 1.

Preparation of Resin Solution

The components shown below were mixed to prepare a resin solution S-1 (resin composition).

| Composition of resin solution S-1 | |
|---|---|
| Resin 1 | 100 parts by mass |
| Colorant A-1 described above | 0.444 parts by mass |
| Ethyl acetate (solvent) | 574 parts by mass |

Next, the obtained resin solution S-1 was filtered using a filter paper having an absolute filtration accuracy of 10 μm (#63, manufactured by Toyo Roshi Kaisha, Ltd.) and further filtered using a metal-sintered filter having an absolute filtration accuracy of 2.5 µm (FH025, manufactured by Pall Corporation).

Production of Optical Filter

The resin solution S-1 after the filtration treatment was applied onto the base material film 1 using a bar coater so that the film thickness after drying was 5.0 µm, and dried at 100° C., thereby producing an optical filter 101.

Examples 2 to 21 and Comparative Examples 1 to 5

Each optical filter of Examples 2 to 12 and Comparative Examples 1 to 5 was produced in the same manner as in Example 1, except that the colorant used in Example 1 and the amount thereof were as shown in the table below. The thickness of each optical filter was the same as in Example 1. Colorants used in Comparative Examples are shown below.

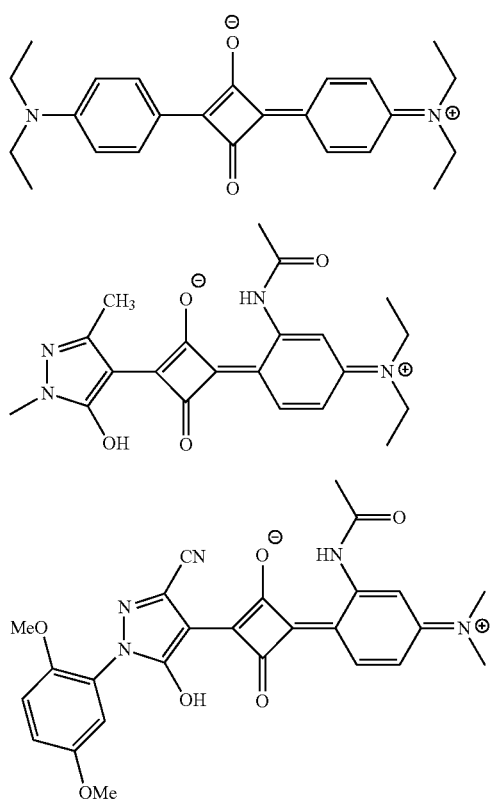

E-1

E-2

E-3

Test Example 1

Evaluation of Light Resistance (Absorbance Change Rate, %) of Optical Filter

The optical filters of each of Examples and Comparative Examples were irradiated with light at 100,000 lux for 90 hours under an environment of 60° C. and a relative humidity of 60% using Super xenon weather meter SX75 manufactured by Suga Test instruments Co., Ltd., the difference in absorbance at the absorption maximum wavelength was measured, and then the absorbance change rate was calculated by the following expression.

(Absorbance change rate) (%)=(difference in absorbance after 90 hour irradiation)/(difference in absorbance before irradiation)×100

The results are shown in the tables below.
Here, the absorption maximum wavelength of an optical filter was determined as follows.

The absorbance of the optical filters of each of Examples and Comparative Examples in a wavelength range of 400 nm to 800 nm was measured every 1 nm using a UV3150 spectrophotometer manufactured by Shimadzu Corporation. The difference in absorbance between the absorbance at each wavelength of the optical filter and the absorbance of a filter not containing the colorant was calculated, and a wavelength at which the difference in absorbance was maximum was defined as the absorption maximum wavelength.

Test Example 2

Fluorescence Emission Suppression Test Using Degree of Polarization as Index

Production of Polarizing Plate

Surface Treatment of Optical Filter (Polarizing Plate Protective Film)

Regarding the optical filters (with the base material film) produced in each of Examples and Comparative Examples, a surface opposite to the base material film was subjected to a corona treatment, thereby producing an optical filter with a surface treatment.

Production of Polarizer (Polarizing Layer)

According to Example 1 of JP2001-141926A, a circumferential speed difference was imparted between two pairs of nip rollers to stretch a film in the longitudinal direction, thereby producing a polarizing layer including a 12 µm-threw polyvinyl alcohol resin.

Production of Front-Side Polarizing Plate Protective Film (Outer Polarizing Plate Protective Film)

Preparation of Acrylic Resin 8000 g of methyl methacrylate (MMA), 2000 g of methyl 2-(hydroxymethyl)acrylate (MHMA), and 10000 g of toluene as a polymerization solvent were charged in a reactor having an inner volume of 30 L which was equipped with a stirrer, a temperature sensor, a cooling pipe, and a nitrogen introduction pipe, and heated up to 107° C. while passing nitrogen through the solution. In a case of beginning a reflux caused by the heating, 10 g of t-amyl peroxyisononanoate was added thereto as a polymerization initiator, solution polymerization was progressed under reflux at approximately 105° C. to 110° C. while adding a solution consisting of 20 g of t-amyl peroxyisononanoate and 100 g of toluene dropwise for 2 hours, and aging was further performed for 4 hours. The polymerization reaction rate was 95%, and the content rate (weight ratio) of MHMA in the obtained polymer was 20%.

Next, 10 g of a stearyl phosphate/distearyl phosphate mixture (manufactured by Sakai Chemical industry Co., Ltd., Phoslex A-18) was added to the obtained polymerization solution as a cyclization catalyst, and a cyclization condensation reaction was progressed under reflux at approximately 80° C. to 100° C. for 5.5 hours.

Next, the obtained polymerization solution was introduced into a vent-type screw twin-screw extruder ($\phi$=29.75 mm, L/D=30) having a barrel temperature of 260° C., a rotation speed of 100 rpm, a degree of pressure reduction of 13 to 400 hPa (10 to 300 mmHg), and one rear vent and four fore-vents at a treatment rate of 2.0 kg/hour in terms of resin amount, and a cyclization condensation reaction and devolatilization were performed in the extruder. Next, after completion of the devolatilization, the resin in a hot-melt state remaining in the extruder was discharged from a front end of the extruder and pelletized using a pelletizer, thereby obtaining a (meth)acrylic resin A. The (meth)acrylic resin A had a lactone ring structure. The weight-average molecular weight of the resin was 110000, and the glass transition temperature was 125° C.

Production of Outer Polarizing Plate Protective Film 100 parts by mass of the (meth)acrylic resin A and 10 parts by mass of a rubber elastic body C-1 were supplied to a twin-screw extruder, melted and extruded in a sheet shape at approximately 280° C., thereby producing a 40 µm-thick long outer polarizing plate protective film. As the rubber elastic body C-1, KANE ACE M-210 (manufactured by Kaneka) was used.

Attachment

The polarizing layer and the optical filter with a surface treatment were laminated together using a 3% by mass aqueous solution of polyvinyl alcohol (manufactured by Kuraray Co., Ltd., PVA-117H) in a roll-to-roll manner so that the corona-treated surface of the optical filter was located on the polarizing layer side and the absorption axis of the polarizing layer and the longitudinal direction of the optical filter was parallel to each other.

Next, an adhesive M having the following composition was applied to the outer polarizing plate protective film using a microgravure coater (gravure roll: #300, rotation speed: 140%/line speed) so that the thickness was 5 µm, thereby producing an adhesive-attached front polarizing plate protective film. Next, the adhesive-attached front polarizing plate protective film and the polarizing layer were attached together such that a surface of the adhesive-attached front polarizing plate protective film to which the adhesive was attached and a surface of the polarizing layer to which the optical filter was not attached were attached together, and irradiated with ultraviolet rays from the optical filter side, thereby producing a polarizing plate. The line speed was set to 20 m/min, and the accumulated light amount of ultraviolet rays was set to 300 mJ/cm². Here, the polarizer and the outer polarizing plate protective film were disposed such that the transmission axis of the polarizer and the transportation direction of the outer polarizing plate protective film were orthogonal to each other.

-Composition of adhesive M-

100 parts by mass of 2-hydroxyethyl acrylate
10 parts by mass of totylene diisoeyanate
3 parts by mass of photopolymerization initiator (Irgacure 907, manufactured by BASF)

Next, the polarizing plate was dried at 70° C., the base material film of the optical filter was continuously peeled off using the same device as a separator-peeling device having a peeling roller, and a commercially available acrylate-based pressure-sensitive adhesive was applied to the peeled surface, thereby producing a polarizing plate (pressure-sensitive adhesive/optical filter/polarizing layer/outer polarizing plate protective film).

The degree of polarization of the obtained polarizing plate (5 cm×5 cm) was measured. The polarizing plate was attached onto a glass through a pressure-sensitive adhesive so that the optical filter was on the glass side. The sample was set in an automatic polarizing film measurement instrument VAP-7070 manufactured by JASCO Corporation such that the glass side of the sample faced a light source, and the orthogonal transmittance and the parallel transmittance in a wavelength range of 380 nm to 700 nm were measured. A polarization degree spectrum was calculated from the measurement values of the orthogonal transmittance and the parallel transmittance using the following expression, and the weighted average of the light source (auxiliary illuminant C) and the CIE luminosity factor (Y) was computed, thereby calculating the degree of polarization.

Degree of polarization (%)=[(parallel transmittance−orthogonal transmittance)/(parallel transmittance+orthogonal transmittance)]$^{1/2}$×100

The results are shown in the tables below.

Test Example 3

Relative Absorbance at 450 nm

In a case where an absorbance at the absorption maximum wavelength was set to 1 in the optical filters of each of Examples and Comparative Examples, the relative value (relative value at 450 nm) of the absorbance at a wavelength of 450 nm was calculated and evaluated based on the following evaluation standard.

Evaluation Standard of Absorbance at 450 nm

A: relative value of the absorbance at 450 nm to the absorbance 1 at the absorption maximum wavelength is less than 0.01.

B: relative value of the absorbance at 450 nm to the absorbance 1 at the absorption maximum wavelength is 0.01 or more and less than 0.03.

C: relative value of the absorbance at 450 nm to the absorbance 1 at the absorption maximum wavelength is 0.03 or more.

The results are shown in the tables below.

Test Example 4

Evaluation of Surface Condition

A surface (surface opposite to the base material film) of the optical filter produced in each of Examples and Comparative Examples was observed with an optical microscope (MX-61L, manufactured by Olympus Corporation) at a bright field of 200 times. The observed surface condition was evaluated based on the following evaluation standard.

Evaluation Standard of Surface Condition

A: no unevenness was observed.
B: unevenness was observed.
"Unevenness" is a state in which the surface is not uniform but rough. More specifically, "unevenness" is a state in which light and shade appear in the color.
The results are shown in the tables below.

On the other hand, as compared with Comparative Example 1, the filters of Examples 1 to 10, which are formed of the colorant compound in the present invention, are capable of realizing a high degree of polarization, have excellent light resistance, and exhibit excellent surface condition without unevenness or crystal precipitation.

The same results are also shown in Table 4. The colorant compound E-2 used in Comparative Example 3 is a com-

TABLE 3

| | Colorant | | | | Relative | | |
|---|---|---|---|---|---|---|---|
| | Type | Addition amount[*2] | Resin | Degree of polarization | value at 450 nm | Light resistance | Surface condition |
| Example 1 | A-1 | 0.444 | Polystyrene | 97.5 | A | 21 | A |
| Example 2 | A-2 | 0.273 | | 98.1 | A | 51 | A |
| Example 3 | A-3 | 0.725 | | 98.5 | A | 53 | A |
| Example 4 | A-4 | 1.030 | | 98.1 | A | 49 | A |
| Example 5 | A-6 | 0.767 | | 98 | A | 45 | A |
| Example 6 | A-7 | 0.510 | | 98.5 | A | 55 | A |
| Example 7 | A-8 | 0.647 | | 97.5 | A | 30 | A |
| Example 8 | A-10 | 0.568 | | 98.1 | A | 52 | A |
| Example 9 | A-11 | 0.540 | | 97.6 | A | 28 | A |
| Example 10 | A-17 | 0.709 | | 97.5 | A | 35 | A |
| Comparative Example 1 | E-1 | 0.335 | | 97.0 | A | 10 | B (unevenness) |
| Comparative Example 2 | E-1*1 | 0.335 | | 97.2 | A | 15 | B (unevenness) |

*1: the following compound (corresponding $Q^1$ in the colorant A-6) is added to the colorant E-1
*2: parts by mass of the colorant with respect to 100 parts by mass of the resin

TABLE 4

| | Colorant | | | | Relative | | |
|---|---|---|---|---|---|---|---|
| | Type | Addition amount[*4] | Resin | Degree of polarization | value at 450 nm | Light resistance | Surface condition |
| Example 11 | B-1 | 0.235 | Polystyrene | 99.85 | A | 70 | A |
| Example 12 | B-2 | 0.574 | | 99.93 | A | 80 | A |
| Example 13 | B-3 | 0.882 | | 99.95 | A | 85 | A |
| Example 14 | B-6 | 0.582 | | 99.85 | A | 83 | A |
| Example 15 | B-7 | 0.748 | | 99.95 | A | 88 | A |
| Example 16 | B-9 | 0.794 | | 99.81 | A | 66 | A |
| Example 17 | B-12 | 0.528 | | 99.95 | A | 83 | A |
| Example 18 | B-13 | 0.259 | | 99.95 | A | 86 | A |
| Example 19 | B-15 | 0.891 | | 99.9 | A | 79 | A |
| Example 20 | B-17 | 0.705 | | 99.75 | A | 64 | A |
| Example 21 | B-22 | 0.560 | | 99.9 | A | 80 | A |
| Comparative Example 3 | E-2 | 0.353 | | 99.7 | A | 55 | B (unevenness) |
| Comparative Example 4 | E-2*3 | 0.353 | | 99.72 | A | 57 | B (unevenness) |
| Comparative Example 5 | E-3 | 0.446 | | 98.3 | A | 45 | A |

*3: α-tocopherol is added to the colorant E-2 in an equimolar amount.
*4: parts by mass of the colorant with respect to 100 parts by mass of the resin First, the results of Table 3 will be described. The squarylium colorant E-1 used in Comparative Example 1 is a compound having a structure corresponding to Dye of the colorant compounds used in Examples 1 to 9. It is found that the filter of Comparative Example 1 reduces the degree of polarization of the polarizing plate. This is because E-1 emits fluorescence due to absorption of light and depolarization occurs. In addition, the colorant E-1 is also inferior in light resistance, and unevenness is observed on the filter surface formed of the colorant E-1. In addition, the tendency is not significantly improved even in a case where a compound corresponding, $Q^1$ is added to the colorant E-1 (Comparative Example 2).

pound having a structure corresponding to Dye of the colorant compounds used in Examples 11 to 20. It is found that the filter of Comparative Example 3 reduces the degree of polarization of the polarizing plate. In addition, the colorant E-2 is also inferior in light resistance, and unevenness is observed on the filter surface formed of the colorant E-2. In addition, the tendency is not significantly improved even in a case where a compound corresponding $Q^1$ is added to the colorant E-2 (Comparative Example 4). In addition, in a case where the compound corresponding to $Q^1$ is bonded to Dye with a single bond, it is found that the degree of polarization of the polarizing plate is reduced and light resistance is also low (Comparative Example 5).

On the other hand, as compared with Comparative Examples 3 to 5, the filters of Examples 11 to 21, which are formed of the colorant compound in the present invention, are capable of realizing a high degree of polarization, have excellent light resistance, and exhibit excellent surface condition without unevenness or crystal precipitation.

The present invention has been described with the embodiments thereof, any details of the description of the present invention are not limited unless described otherwise, and it is obvious that the present invention is widely construed without departing from the gist and scope of the present invention described in the accompanying claims.

EXPLANATION OF REFERENCES

1: upper polarizing plate
2: direction of absorption axis of upper polarizing plate
3: liquid crystal cell upper electrode substrate
4: alignment control direction of upper substrate
5: liquid crystal layer
6: liquid crystal cell lower electrode substrate
7: alignment control direction of lower substrate
8: lower polarizing plate
9: direction of absorption axis of lower polarizing plate
B: backlight unit
10: liquid crystal display device

What is claimed is:
1. A resin composition comprising:
a compound represented by Formula (1); and
a resin,

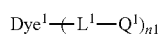

Formula (1)

in Formula (1), Dye represents a colorant structural part obtained by removing n1 hydrogen atoms from a compound represented by Formula (2),

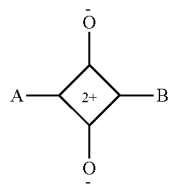

Formula (2)

in Formula (2), A and B represent an aryl group and a heterocyclic group, or —CH=G, in which G represents a heterocyclic group, $Q^1$ represents a structural part satisfying the following (i) and (ii), (i) an energy level difference between a highest occupied molecular orbital and a lowest unoccupied molecular orbital is 2.9 eV or more, (ii) an absolute value of the energy level of the lowest unoccupied molecular orbital is lower than an absolute value of an energy level of a lowest unoccupied molecular orbital of Dye, or an absolute value of the energy level of the highest occupied molecular orbital is lower than an absolute value of an energy level of a highest occupied molecular orbital of Dye, $L^1$ represents a divalent linking group in which a linking part with $Q^1$ is composed of an alkylene group, or a divalent linking group which is directly bonded to a ring-constituting carbon atom of an aliphatic ring included in $Q^1$, and n1 represents an integer of 1 to 4, wherein Dye is a structure up to a portion where a conjugated structure is interrupted due to that the structure of Formula (2) is linked to $L^1$, and wherein $Q^1$ represents a structural part obtained by removing one hydrogen atom from a compound represented by any one of Formulae (5) to (13),

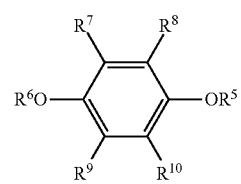

Formula (5)

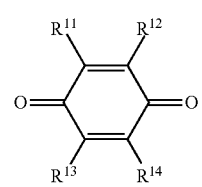

Formula (6)

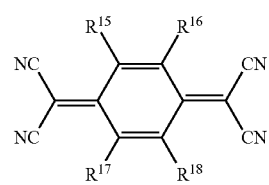

Formula (7)

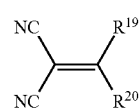

Formula (8)

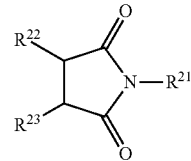

Formula (9)

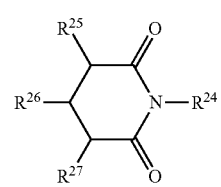

Formula (10)

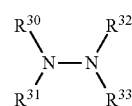

Formula (11)

-continued

Formula (12)

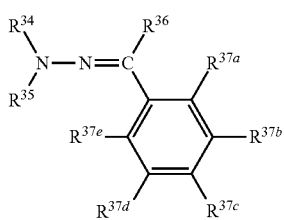

Formula (13)

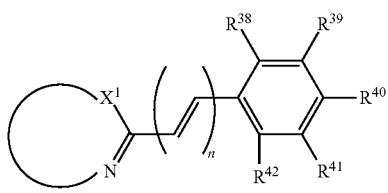

$R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$ represent a hydrogen atom or a substituent, $R^{21}$ and $R^{24}$ represent a hydrogen atom, an alkyl group, an aryl group, or a heterocyclic group, provided that, in a case where $R^{21}$ and $R^{24}$ are hydrogen atoms, $Q^1$ is bonded to the linking group $L^1$ at a nitrogen atom position from which the hydrogen atom has been removed, $X^1$ represents an oxygen atom, a sulfur atom, or a carbon atom, and n represents an integer of 1 to 3.

2. The resin composition according to claim 1,
wherein A in Formula (2) is a heterocyclic group.

3. The resin composition according to claim 1,
wherein Dye represents a colorant structural part obtained by removing n1 hydrogen atoms from a compound represented by Formula (3), Formula (3)

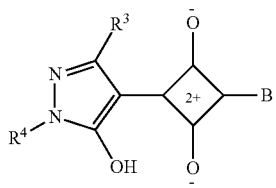

$R^3$ and $R^4$ represent a hydrogen atom or a substituent, and
B is the same as B in Formula (2).

4. The resin composition according to claim 1,
wherein the resin is at least one kind of a polystyrene resin, a cellulose acylate resin, an acrylic resin, or a cycloolefin resin.

5. A film comprising:
the resin composition according to claim 1.

6. An optical filter comprising:
the resin composition according to claim 1.

7. An image display device comprising:
the optical filter according to claim 6.

8. A solid-state imaging element comprising:
the optical filter according to claim 6.

9. A compound represented by Formula (1A),

Formula (1A)

$$Dye^1\text{---}(L^1\text{---}Q^1)_{n1}$$

in Formula (1A), $Dye^1$ represents a colorant structural part obtained by removing n1 hydrogen atoms from a compound represented by Formula (2A), Formula (2A)

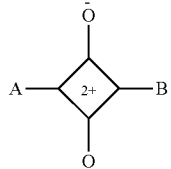

in Formula (2A), A represents a heterocyclic group and B represents an aryl group, a heterocyclic group, or —CH=G, in which G represents a heterocyclic group, $Q^1$ represents a structural part satisfying the following (i) and (ii), (i) an energy level difference between a highest occupied molecular orbital and a lowest unoccupied molecular orbital is 2.9 eV or more, (ii) an absolute value of the energy level of the lowest unoccupied molecular orbital is lower than an absolute value of an energy level of a lowest unoccupied molecular orbital of Dye, or an absolute value of the energy level of the highest occupied molecular orbital is lower than an absolute value of an energy level of a highest occupied molecular orbital of Dye, $L^1$ represents a divalent linking group in which a linking part with $Q^1$ is composed of an alkylene group, or a divalent linking group which is directly bonded to a ring-constituting carbon atom of an aliphatic ring included in $Q^1$, and n1 represents an integer of 1 to 4, wherein $Dye^1$ is a structure up to a portion where a conjugated structure is interrupted due to that the structure of Formula (2A) is linked to $L^1$, and wherein $Q^1$ represents a structural part obtained by removing one hydrogen atom from a compound represented by any one of Formulae (5) to (13), Formula (5)

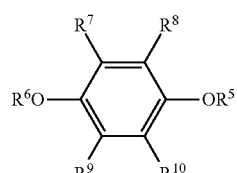

Formula (6)

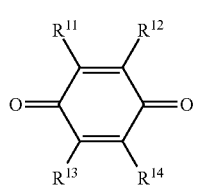

-continued

Formula (7)
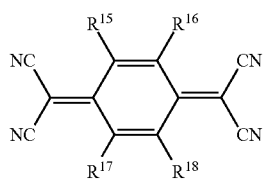

Formula (8)
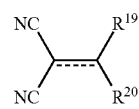

Formula (9)
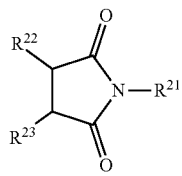

Formula (10)
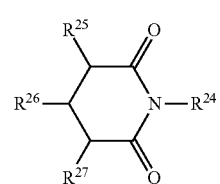

Formula (11)
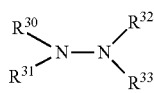

Formula (12)
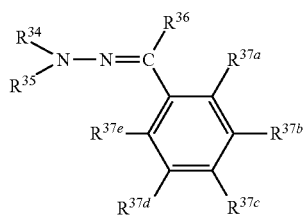

-continued

Formula (13)
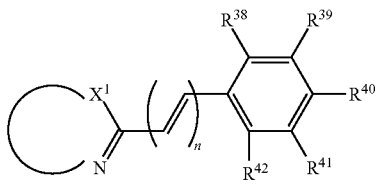

$R^5$ to $R^{20}$, $R^{22}$, $R^{23}$, $R^{25}$ to $R^{27}$, $R^{30}$ to $R^{36}$, $R^{37a}$ to $R^{37e}$, and $R^{38}$ to $R^{42}$ represent a hydrogen atom or a substituent, $R^{21}$ and $R^{24}$ represent a hydrogen atom, an alkyl group, an aryl group, or a heterocyclic group, provided that, in a case where $R^{21}$ and $R^{24}$ are hydrogen atoms, $Q^1$ is bonded to the linking group $L^1$ at a nitrogen atom position from which the hydrogen atom has been removed, $X^1$ represents an oxygen atom, a sulfur atom, or a carbon atom, and n represents an integer of 1 to 3.

10. The compound according to claim 9, wherein $Dye^1$ represents a colorant structural part obtained by removing n1 hydrogen atoms from a compound represented by Formula (3), Formula (3)
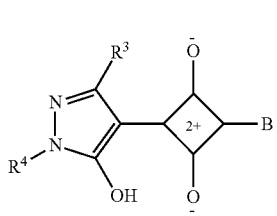

$R^3$ and $R^4$ represent a hydrogen atom or a substituent, and B is the same as B in Formula (2A).

* * * * *